(12) United States Patent
Yanai et al.

(10) Patent No.: US 12,364,078 B2
(45) Date of Patent: Jul. 15, 2025

(54) LIGHT-EMITTING DEVICE AND METHOD FOR MANUFACTURING LIGHT-EMITTING DEVICE

(71) Applicant: HAMAMATSU PHOTONICS K.K., Hamamatsu (JP)

(72) Inventors: Takahide Yanai, Hamamatsu (JP); Yoshihiro Okuyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 621 days.

(21) Appl. No.: 17/615,159

(22) PCT Filed: May 27, 2020

(86) PCT No.: PCT/JP2020/020979
§ 371 (c)(1),
(2) Date: Nov. 30, 2021

(87) PCT Pub. No.: WO2020/246345
PCT Pub. Date: Dec. 10, 2020

(65) Prior Publication Data
US 2022/0238775 A1    Jul. 28, 2022

(30) Foreign Application Priority Data
Jun. 4, 2019   (JP) ................. 2019-104874

(51) Int. Cl.
*H10H 20/857*   (2025.01)
*H10H 20/01*    (2025.01)
*H10H 20/814*   (2025.01)

(52) U.S. Cl.
CPC .......... *H10H 20/857* (2025.01); *H10H 20/01* (2025.01); *H10H 20/814* (2025.01); *H10H 20/0364* (2025.01)

(58) Field of Classification Search
CPC ..... H01L 33/62; H01L 2224/46–48499; H01L 2924/12041; H01L 2924/181–18301;
(Continued)

(56) References Cited

U.S. PATENT DOCUMENTS

2002/0192927 A1*  12/2002  Yamada ................. H01L 21/78
                                              438/33
2004/0056608 A1    3/2004  Dietz et al.
(Continued)

FOREIGN PATENT DOCUMENTS

CN    102969434 A  *  3/2013
CN    104821358 A     8/2015
(Continued)

OTHER PUBLICATIONS

International Preliminary Report on Patentability mailed Dec. 16, 2021 for PCT/JP2020/020979.

*Primary Examiner* — Syed I Gheyas
*Assistant Examiner* — Casey Paul Boatman
(74) *Attorney, Agent, or Firm* — Faegre Drinker Biddle & Reath LLP

(57) ABSTRACT

In a method for making a light-emitting device, a plurality of windows (20) on which light source (10) are mounted is prepared, an block (AG1) in which a plurality of packages (30) are connected in an array is prepared, the window (20) is mounted in each package (30) of the block (AG1) to electrically connect a first pad (25) and a second pad (36) corresponding to each other, and the block (AG1) is separated to obtain the plurality of packages (30) on which the corresponding window (20) are mounted.

14 Claims, 15 Drawing Sheets

(58) Field of Classification Search
CPC . H01L 33/005; H01L 21/6836; H10H 20/857; H10H 20/01; H10H 20/814; H10H 20/0364
See application file for complete search history.

(56) References Cited

U.S. PATENT DOCUMENTS

| | | | |
|---|---|---|---|
| 2005/0072835 A1* | 4/2005 | Choi | B23K 35/262 |
| | | | 257/E21.511 |
| 2010/0207142 A1* | 8/2010 | Chen | H01L 25/0753 |
| | | | 257/98 |
| 2011/0291124 A1* | 12/2011 | DeSamber | H01L 25/167 |
| | | | 257/E27.12 |
| 2013/0127000 A1 | 5/2013 | Oganesian | |
| 2013/0178006 A1* | 7/2013 | Kim | H01L 21/78 |
| | | | 438/33 |
| 2014/0361326 A1* | 12/2014 | Song | H01L 25/167 |
| | | | 257/98 |
| 2019/0067544 A1* | 2/2019 | Kim | H01L 33/642 |

FOREIGN PATENT DOCUMENTS

| | | | | |
|---|---|---|---|---|
| CN | 102969434 B | * | 12/2015 | |
| CN | 107850489 A | | 3/2018 | |
| DE | 102011081459 A1 | | 2/2013 | |
| JP | H4-260368 A | | 9/1992 | |
| JP | H5-175535 A | | 7/1993 | |
| JP | H9-293893 A | | 11/1997 | |
| JP | H10-335706 A | | 12/1998 | |
| JP | 2000347601 A | * | 12/2000 | |
| JP | 2002-094129 A | | 3/2002 | |
| JP | 2002-280614 A | | 9/2002 | |
| JP | 2002-286959 A | | 10/2002 | |
| JP | 2003-163341 A | | 6/2003 | |
| JP | 2004296999 A | * | 10/2004 | |
| JP | 2005-038870 A | | 2/2005 | |
| JP | 2007-311640 A | | 11/2007 | |
| JP | 2009152227 A | * | 7/2009 | ........... H01L 33/483 |
| JP | 2015-149471 A | | 8/2015 | |
| JP | 2016-051780 A | | 4/2016 | |
| JP | 2017/022840 A1 | | 8/2017 | |
| JP | 2018-182053 A | | 11/2018 | |
| JP | 6794498 B1 | | 12/2020 | |
| WO | WO-2009/078264 A1 | | 6/2009 | |
| WO | WO-2017/022840 A1 | | 2/2017 | |

* cited by examiner

Fig.2
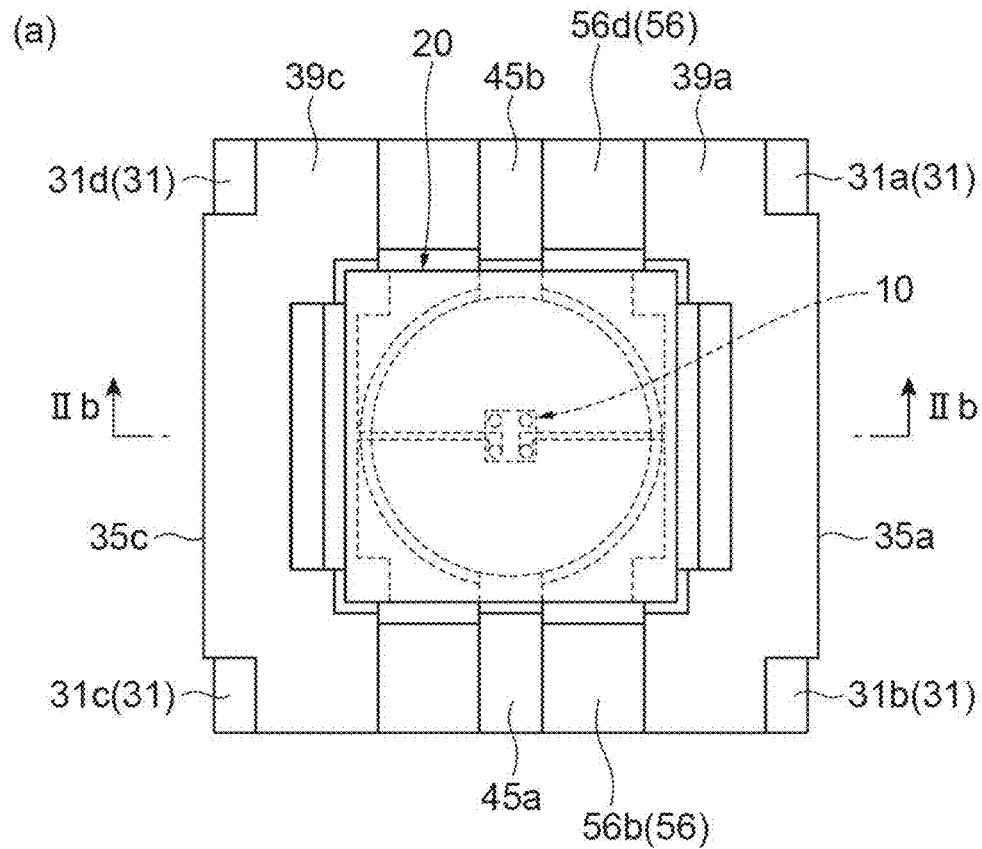
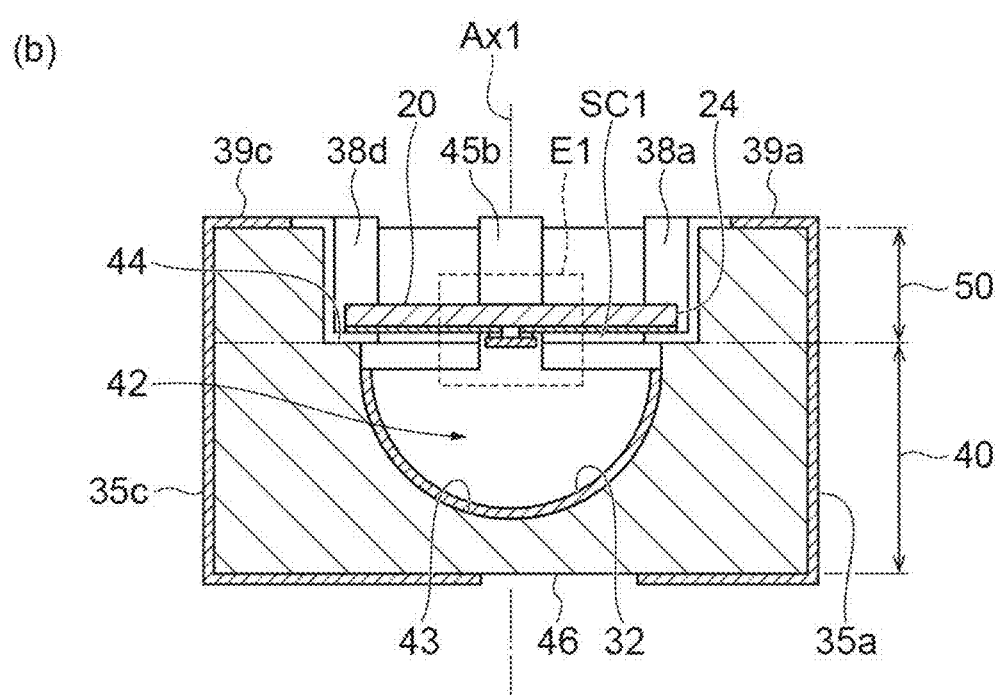

Fig.5
(a)
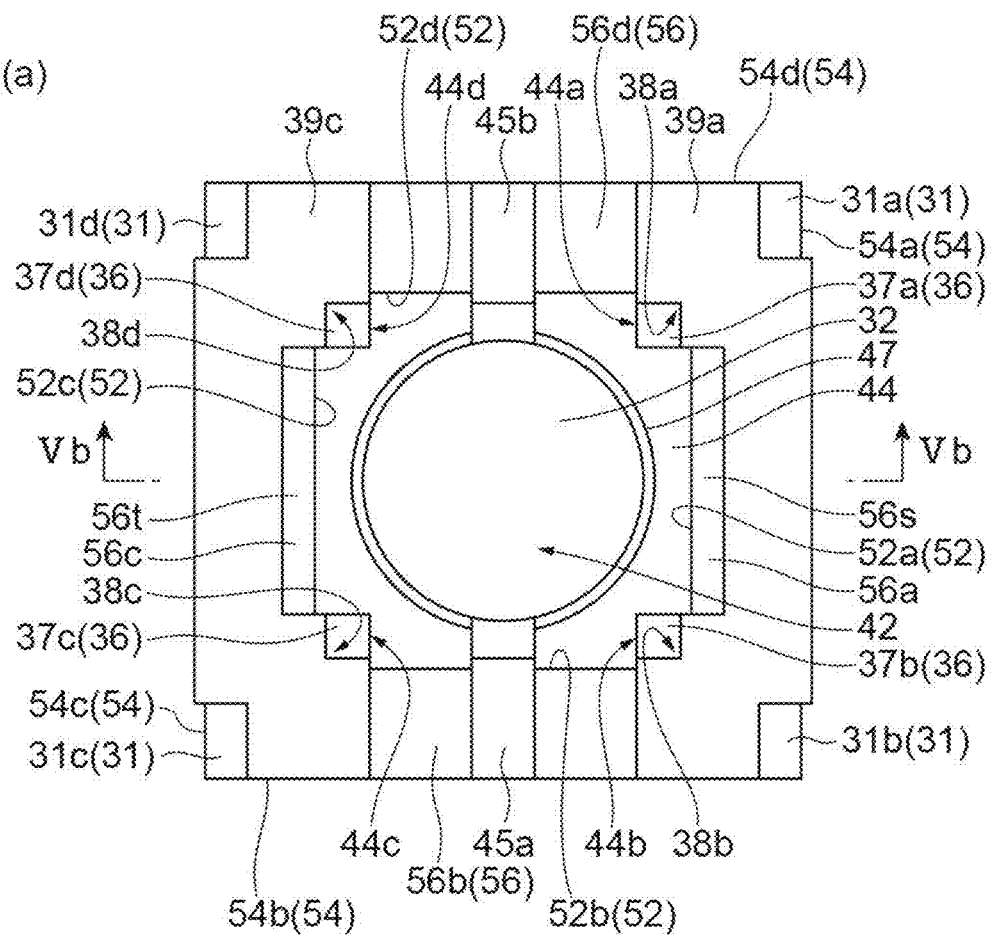
(b)
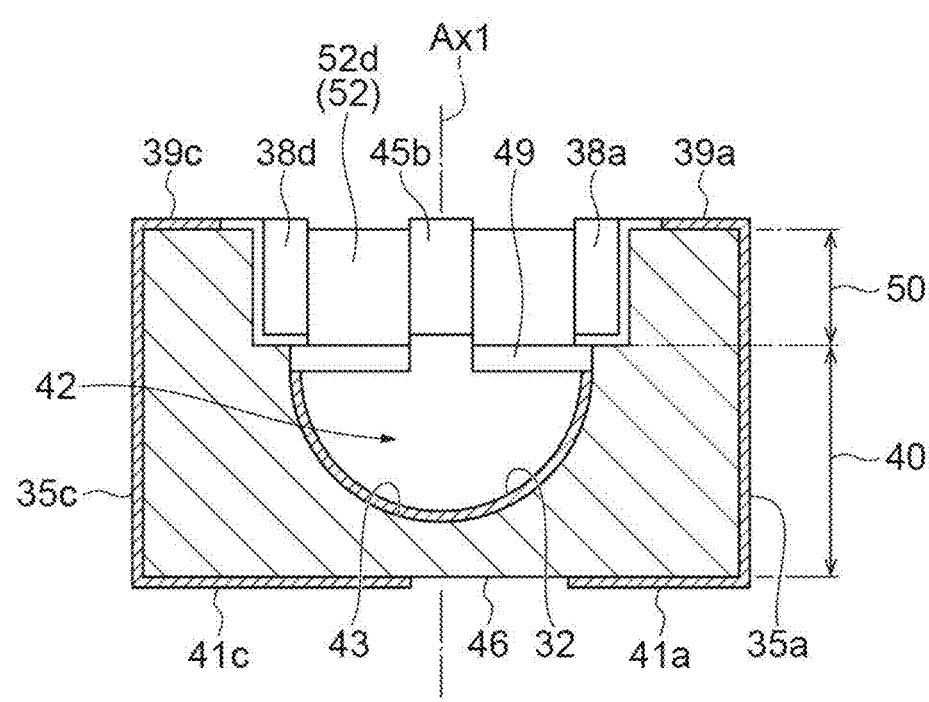

*Fig.6*
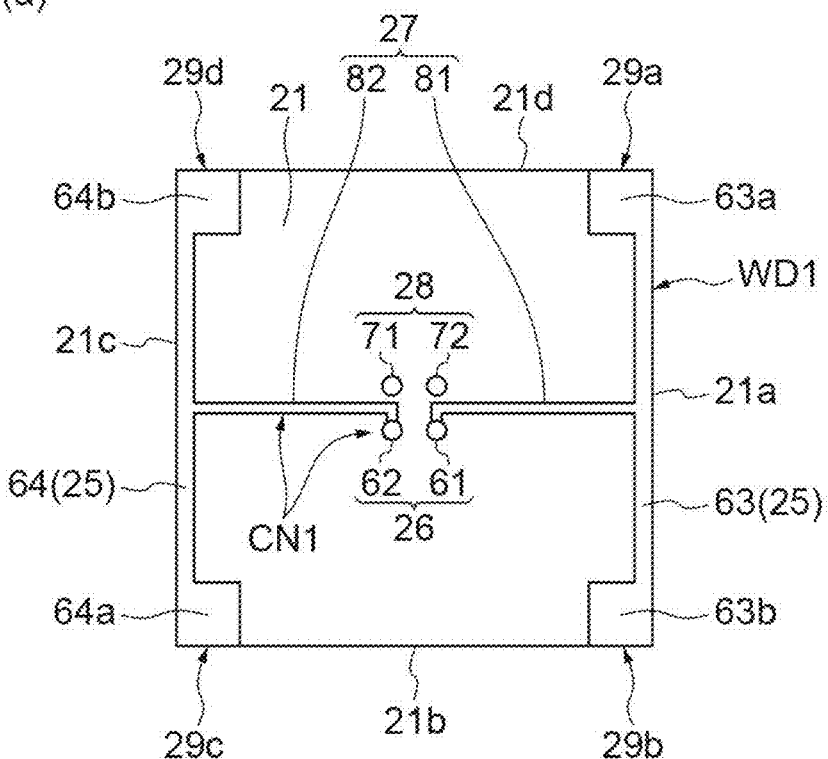
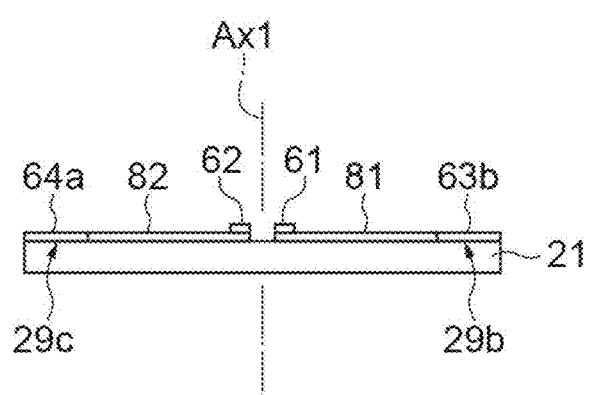

Fig.8
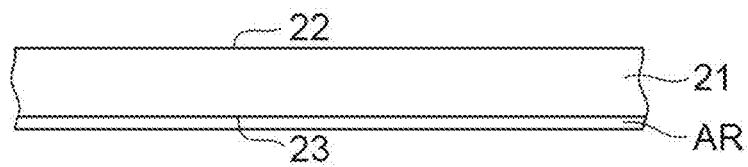
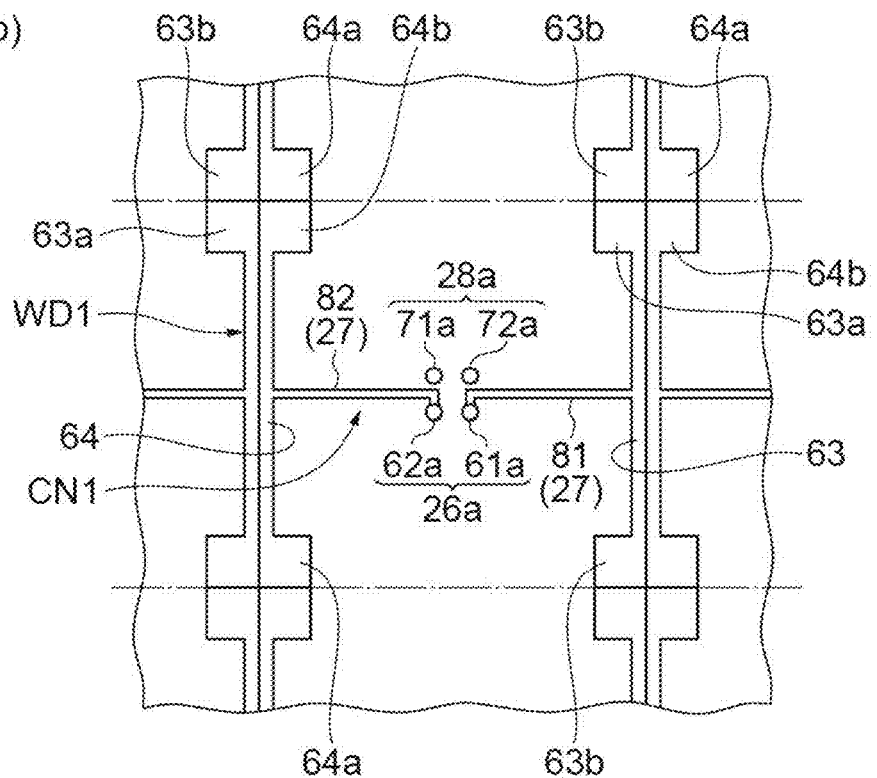
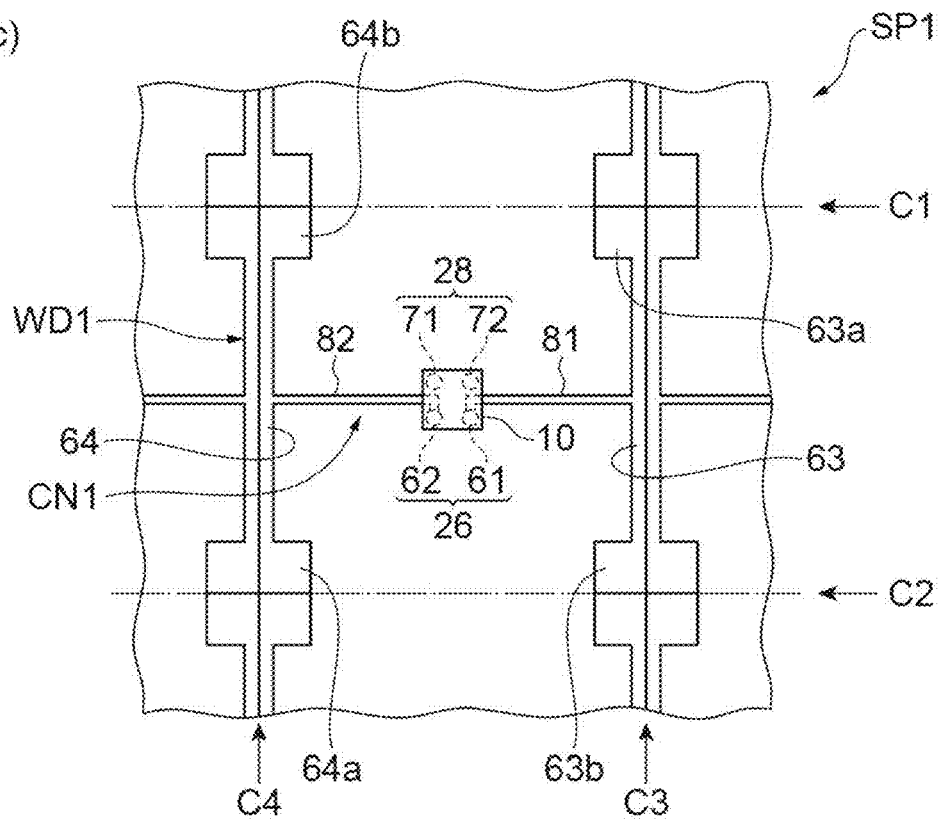

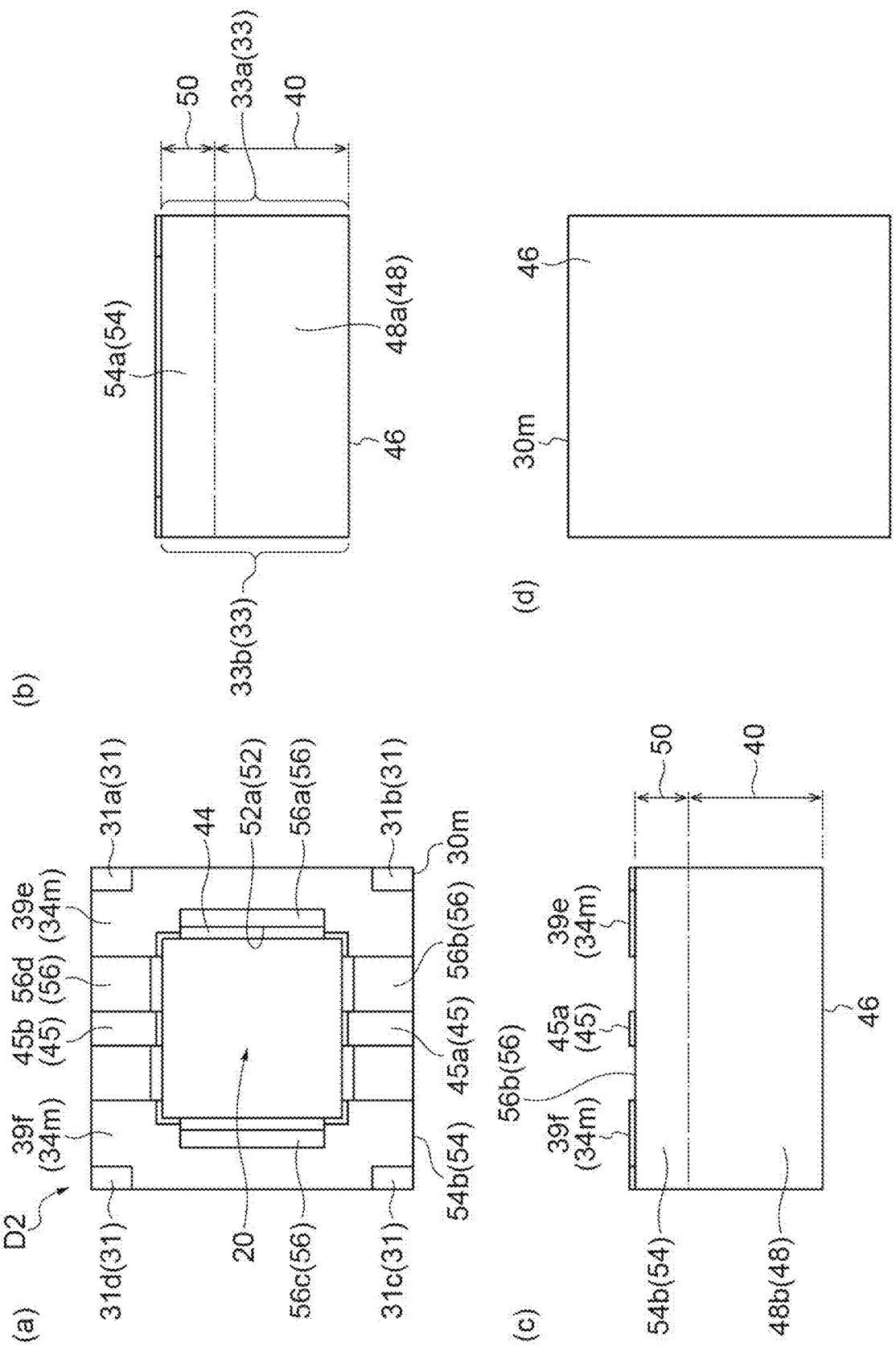

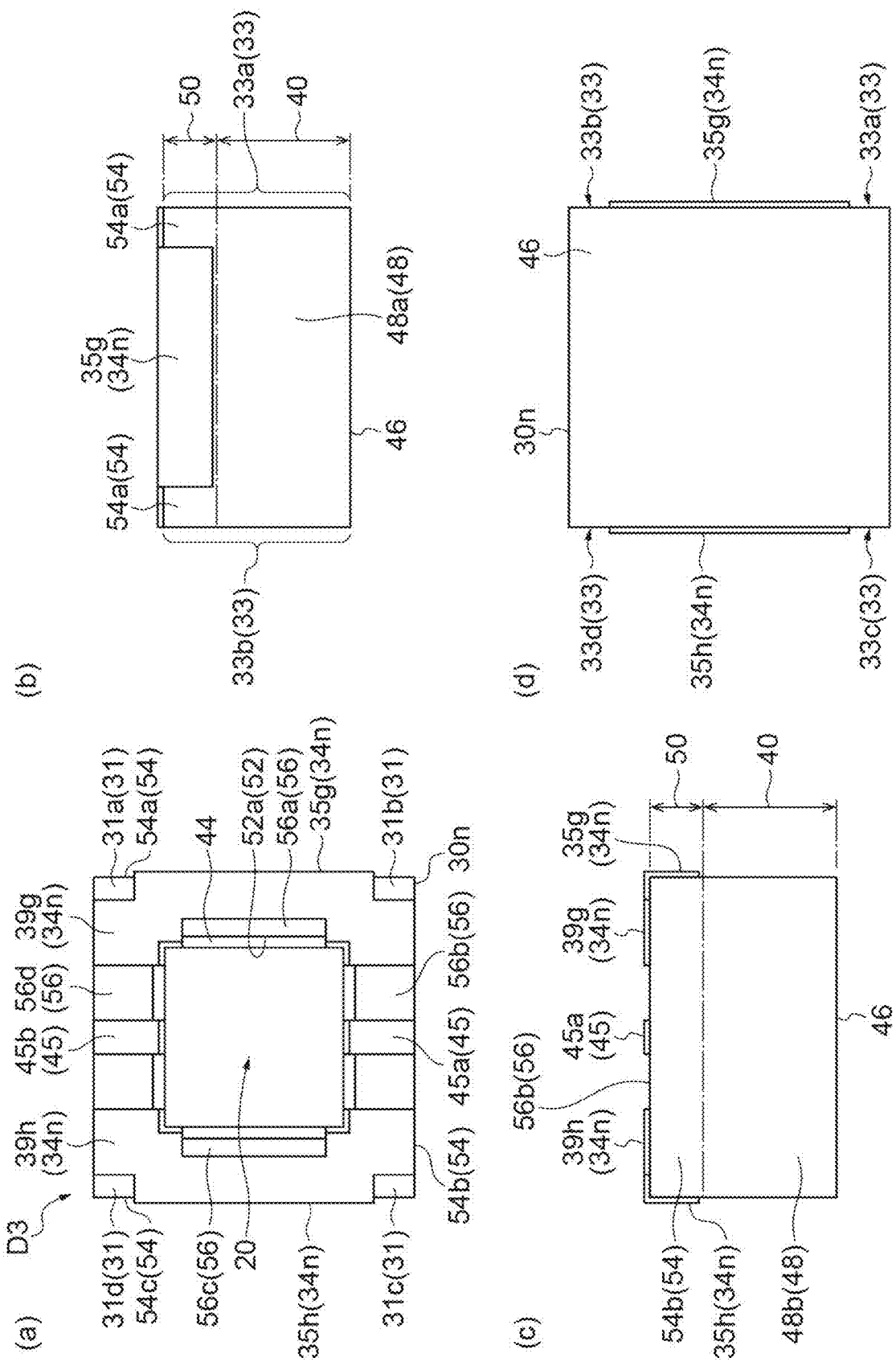

LIGHT-EMITTING DEVICE AND METHOD FOR MANUFACTURING LIGHT-EMITTING DEVICE

TECHNICAL FIELD

One aspect of the present invention relates to a light-emitting device. Another aspect of the present invention relates to a method for making a light-emitting device.

BACKGROUND ART

Carbon dioxide and methane are environmental gases having absorption in an infrared region. It is desired to analyze these environmental gases with high sensitivity. To meet this desire, a light-emitting device emitting infrared light with high output has been in a process of development. High-output infrared light having a wavelength region of, for example, 3 to 5 μm is obtained by focusing light from a light source including, for example, a light-emitting diode. However, it is not practical from an economic point of view to use a lens as an element focusing infrared light. High-output infrared light is effectively obtained through a reflector as the element focusing infrared light from the light source.

Some proposals have been made for a device focusing light from a light source through a reflecting mirror. Patent Literature 1 discloses a light-emitting device. The light-emitting device includes a light-emitting diode, a phosphor that wavelength-converts light from the light-emitting diode to generate white light, a reflecting plate that reflects the white light, a transparent plate that emits the white light from the reflecting plate to the outside, and a case housing the light-emitting diode, the phosphor, the reflecting plate, and the transparent plate. Patent Literature 2 discloses a light-emitting diode. The light-emitting diode includes a light-emitting diode element and a metal reflecting mirror that reflects light from the light-emitting diode element. Patent Literature 3 discloses a light-emitting diode lamp. The light-emitting diode lamp includes a light-emitting diode chip, a reflection surface of a concave curved surface that reflects light from the light-emitting diode chip, a light transmissive substrate that transmits light from the reflection surface to the outside, and a fixed cover that covers these ones.

CITATION LIST

Patent Literature

Patent Literature 1: Japanese Unexamined Patent Publication No. 2000-347601
Patent Literature 2: Japanese Unexamined Patent Publication No. 2002-280614
Patent Literature 3: Japanese Unexamined Patent Publication No. H10-335706

SUMMARY OF INVENTION

Technical Problem

A light-emitting element including a light-emitting diode emits light upon receiving electric power supplied from an electric power supply. For this reason, a light output of the light-emitting element may be reduced, and a life of the light-emitting element may be shortened by a heat generated in the light-emitting element due to light emission and a heat from an electric line portion that transmits the electric power. It is important to effectively dissipate the heat generated in the light-emitting element.

In the light-emitting device of Patent Literature 1, the transparent plate is disposed on the case to cover an entire one surface of the case. Therefore, the transparent plate tends not to dissipate the heat generated in the light-emitting diode to the outside of the case effectively. In the light-emitting diode of Patent Literature 2, the amount of electrodes that perform a heat dissipation function is small. Therefore, the heat generated in the light-emitting diode element tends not to be dissipated toward the outside of the light-emitting diode. In the light-emitting diode lamp of Patent Literature 3, a wire (lead) that supplies power to the light-emitting diode chip is positioned in the fixed cover that covers the light-emitting diode chip. The wire is not exposed to the outside of the fixed cover, and thus the wire tends not to dissipate the heat generated in the light-emitting diode chip.

An object of one aspect of the present invention is to provide a light-emitting device that effectively dissipates heat generated in a light source. An object of another aspect of the present invention to provide a method for making a light-emitting device that effectively dissipates heat generated in a light source.

Solution to Problem

A light-emitting device according to one aspect includes: a light source; a window mounting the light source; and a package defining a space with the window, the light source being disposed in the space. The window includes: a window base including a light exit surface, a lower surface opposing the light exit surface, and a side surface coupling the light exit surface and the lower surface; and an electrically conductive body disposed on the lower surface of the window base. The package includes: a base portion formed with a recess open toward the lower surface, the base portion including a placement surface disposed along an edge of the recess and opposing the lower surface, a bottom surface opposing the placement surface, and an outer side surface coupled to the bottom surface; a wall portion including an inner wall surface coupled to the placement surface and opposing the side surface, an outer wall surface opposing the inner wall surface and coupled to the outer side surface, and an upper wall surface coupling the inner wall surface and the outer wall surface, the wall portion disposed along the window base when viewed from a direction orthogonal to the light exit surface; a reflection portion disposed on a surface of the recess, being configured to reflect light emitted from the light source to the window; and an electric conductor disposed on the placement surface, the inner wall surface, the upper wall surface, the outer wall surface, and the outer side surface. The window base is configured to transmit the light reflected on the reflection portion. The electrically conductive body includes a plurality of first pads opposing the placement surface, and a plurality of connectors electrically connecting the light source and the plurality of first pads. The electric conductor includes a plurality of second pads disposed on the placement surface to oppose corresponding first pads of the plurality of first pads and electrically connected to the corresponding first pads.

According to the one aspect, the light source mounted on the window emits light to the reflection portion disposed in the recess open toward the lower surface of the window base. The reflection portion reflects the light to the window. The window transmits the light reflected on the reflection portion toward the outside. The reflection portion is disposed on the surface of the recess, and thus the light to be reflected is focused due to the recessed shape of the reflection portion. As a result, the light transmitted through the window has an improved light density, and the improved light density provides the light-emitting device for analyzing the environmental gas with high sensitivity.

In the one aspect, the light source is electrically connected to the plurality of first pads through the plurality of connectors. The plurality of first pads are electrically connected to the electric conductor through the corresponding second pads. The light source is electrically connected to the electric conductor through the first pad and the second pad. The electric conductor is disposed on the placement surface, the inner wall surface, the upper wall surface, the outer wall surface, and the outer side surface. This disposal of the electric conductor provides a large area in contact with the outside of the light-emitting device. The heat generated in the light source due to the supply of power is effectively dissipated through the electric conductor having the large area in contact with the outside.

In the one aspect, the electric conductor may be further disposed on the bottom surface.

The configuration in which the electric conductor is disposed on the bottom surface further increases the area where the electric conductor is in contact with the outside of the light-emitting device. As a result, this configuration further improves heat dissipation through the electric conductor.

In the one aspect, a height from the placement surface to the upper wall surface may be larger than a height from the placement surface to the light exit surface.

In the configuration in which the height from the placement surface to the upper wall surface is larger than the height from the placement surface to the light exit surface, the wall portion disposed along the window base prevents the window base from coining into contact with an external object of the light-emitting device. Damage to the window base is reduced, and thus the window base favorably transmits the light reflected on the reflection portion toward the outside. On the inner wall surface, the electric conductor is disposed in a region from the placement surface to the upper wall surface. Therefore, this disposal further improves the heat dissipation through the electric conductor.

In the one aspect, the package may have a polygonal shape when viewed from the direction orthogonal to the light exit surface. The number of the outer side surfaces and the outer wall surfaces may be plural, respectively. The electric conductor may not be disposed on the corner portion defined by the upper wall surface and the outer wall surfaces adjacent to each other, on a ridge portion defined by the outer wall surfaces adjacent to each other, and on a ridge portion defined by the outer side surfaces adjacent to each other.

The configuration in which the electric conductor is not disposed on the corner portion and the ridge portion of the package reduces peeling of the electric conductor starting from the corner portion and the ridge portion.

In the one aspect, the electric conductor may be disposed on the upper wall surface such that the ratio of the area of the electric conductor to the area of the upper wall surface is 50% or more.

The configuration in which the ratio of the area of the electric conductor to the area of the upper wall surface is 50% or more enhances the heat dissipation through the electric conductor.

In the one aspect, the electric conductor may be disposed on the outer wall surface and the outer side surface such that the ratio of the area of the electric conductor to the sum of the area of the outer wall surface and the area of the outer side surface is 50% or more.

The configuration in which the ratio of the area of the electric conductor to the sum of the area of the outer wall surface and the area of the outer side surface is 50% or more further enhances the heat dissipation through the electric conductor.

In the one aspect, the window may include a dummy pad disposed on the lower surface and mounting the light source.

The light source is stably mounted on the window through the dummy pad. The dummy pad mounts the light source, and thus the dummy pad efficiently receives and dissipates the heat generated in the light source.

In the one aspect, each of the connectors may include a third pad mounting the light source, and the electrically conductive line electrically connecting the first pad and the third pad.

The light source is mounted through the third pad, and the first pad and the third pad are electrically connected through the electrically conductive line. The light source is mounted on the third pad, and is electrically connected to the first pad.

In the one aspect, one connector of the plurality of connectors may include the third pad mounting the light source, and the electrically conductive line electrically connecting the first pad and the third pad. Another connector of the plurality of connectors may include a fourth pad electrically connected to the first pad, and a wire electrically connecting the light source and the fourth pad.

The light source is mounted on the third pad of one connector, and the first pad and the third pad are electrically connected through the electrically conductive line of one connector. The light source is mounted on the third pad and is electrically connected to the first pad. The light source and the fourth pad are electrically connected through the wire of another connector. The fourth pad is electrically connected to the first pad. The light source is electrically connected to the first pad through the wire.

In the one aspect, each of the connectors may include the fourth pad electrically connected to the first pad, and a wire electrically connecting the light source and the fourth pad.

The light source and the fourth pad are electrically connected through the wire of each connector. The fourth pad is electrically connected to the first pad. The light source is electrically connected to the first pad through the wire.

In the one aspect, the window base may be a silicon substrate.

The silicon substrate has high thermal conductivity. The window base increases thermal conduction to the electric conductor. This increase of thermal conduction enables a decrease in the area of the electrically conductive body. In a case where the area of the electrically conductive body is decreased, the electrically conductive body decreases an amount of the light from the reflection portion blocked through the electrically conductive body itself.

In the one aspect, the window may include an antireflection film disposed on at least one surface of the lower surface and the light exit surface.

The antireflection film effectively reduces light reflection on the window base.

A method for making a light-emitting device according to another aspect includes: preparing a plurality of windows mounting the light source; preparing a block including a plurality of the packages coupled each other in an array; mounting the window on each of the packages of the block to electrically connect a second pad and a third pad corresponding to each other; and separating the block to obtain the plurality of packages mounting the corresponding window.

According to the other aspect, the wall portion of the package is disposed along the window base. Thus, when the window is mounted in each package of the block, the window is mounted with the wall portion of the package as a mark. Since the mark exists, the window is easily mounted on each package of the block such that the second pad and the third pad corresponding to each other are electrically connected.

In the other aspect, a height from the placement surface to the upper wall surface may be larger than a height from the placement surface to the light exit surface in a state where the window is mounted to correspond to each package of the block. When the block is separated, the block may be diced along cutting planned lines set between the packages adjacent to each other after the upper wall surface is attached to a dicing tape.

In a case where the height from the placement surface to the upper wall surface may be larger than the height from the placement surface to the light exit surface, only the upper wall surface is attached to the dicing tape when the block is separated due to dicing. The lower surface of the window base does not come into contact with the dicing tape, and the window base is prevented from being deteriorated due to adhesion of the adhesive.

Advantageous Effects of Invention

The one aspect provides the light-emitting device that effectively dissipates the heat generated in the light source. The other aspect provides the method for making the light-emitting device that effectively dissipates the heat generated in the light source.

BRIEF DESCRIPTION OF DRAWINGS

FIG. 2(a) is a plan view of the light-emitting device according to the first embodiment, and FIG. 2(b) is a cross-sectional view taken along a line IIb-IIb in FIG. 2(a).

FIG. 5(a) is a plan view of a package according to the first embodiment, and FIG. 5(b) is a cross-sectional view taken along a line Vb-Vb in FIG. 5(a).

FIG. 6(a) is a plan view of a window according to the first embodiment, and FIG. 6(b) is a front view of the window according to the first embodiment.

FIG. 8 is a view schematically illustrating a main process in the method for making the light-emitting device according to the first embodiment.

FIG. 14(a) is a plan view of a light-emitting device according to a fourth embodiment, and FIG. 14(b) is a side view of the light-emitting device according to the fourth embodiment. FIG. 14(c) is a front view of the light-emitting device according to the fourth embodiment, and FIG. 14(d) is a bottom view of the light-emitting device according to the fourth embodiment.

FIG. 15(a) is a plan view of a light-emitting device according to a fifth embodiment, and FIG. 15(b) is a side view of the light-emitting device according to the fifth embodiment. FIG. 15(c) is a front view of the light-emitting device according to the fifth embodiment, and FIG. 15(d) is a bottom view of the light-emitting device according to the fifth embodiment.

DESCRIPTION OF EMBODIMENTS

Hereinafter, embodiments of the present invention will be described in detail with reference to the accompanying drawings. Note that, in the description, the same reference signs will be used for the same elements or elements having the same function, and redundant description will be omitted.

First Embodiment

Figure 1:
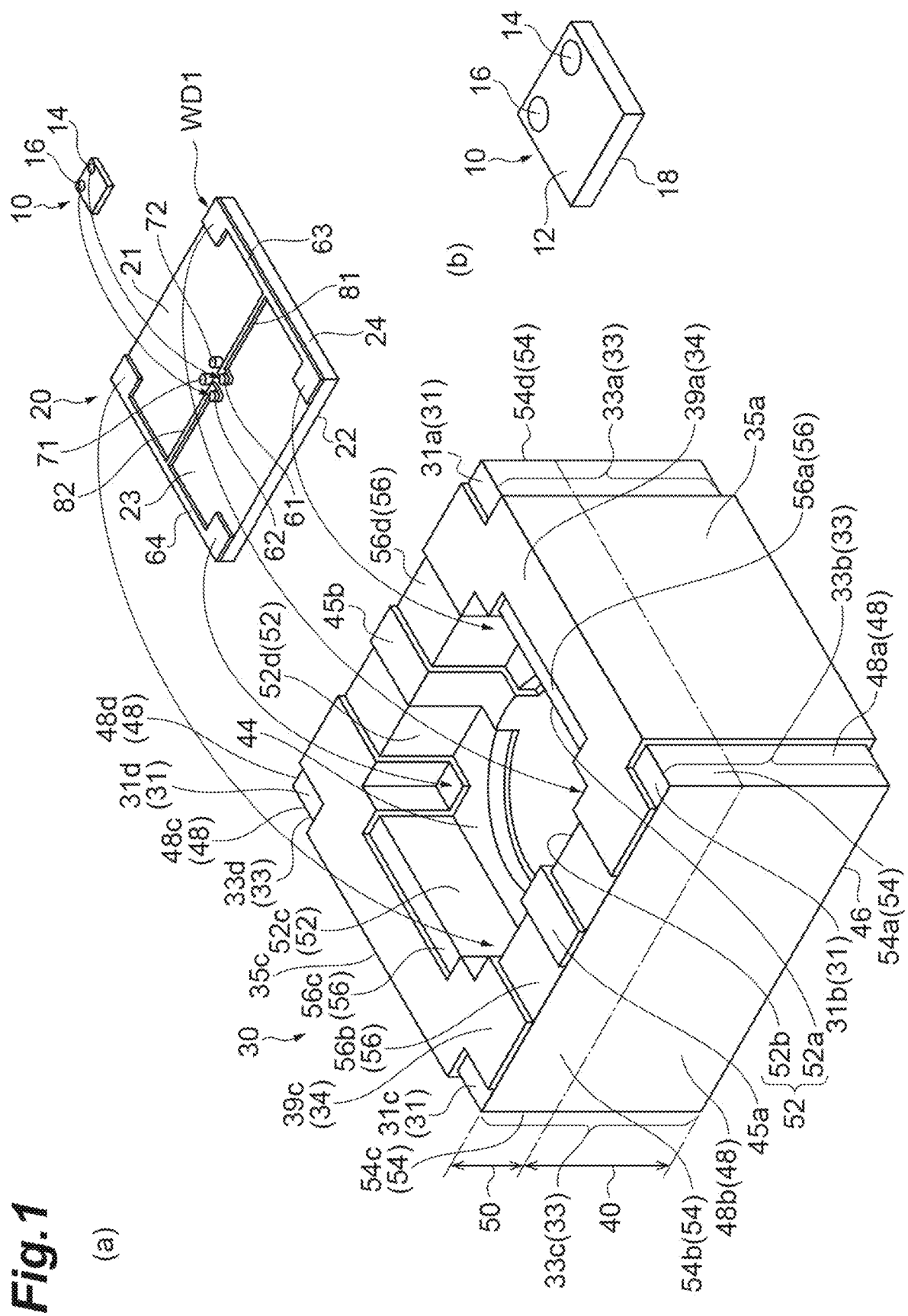
FIG. 1(a) is a view schematically illustrating a configuration of a light-emitting device according to a first embodiment.
FIG. 1(b) is an enlarged view of a light source in FIG. 1(a).
Figure 3:
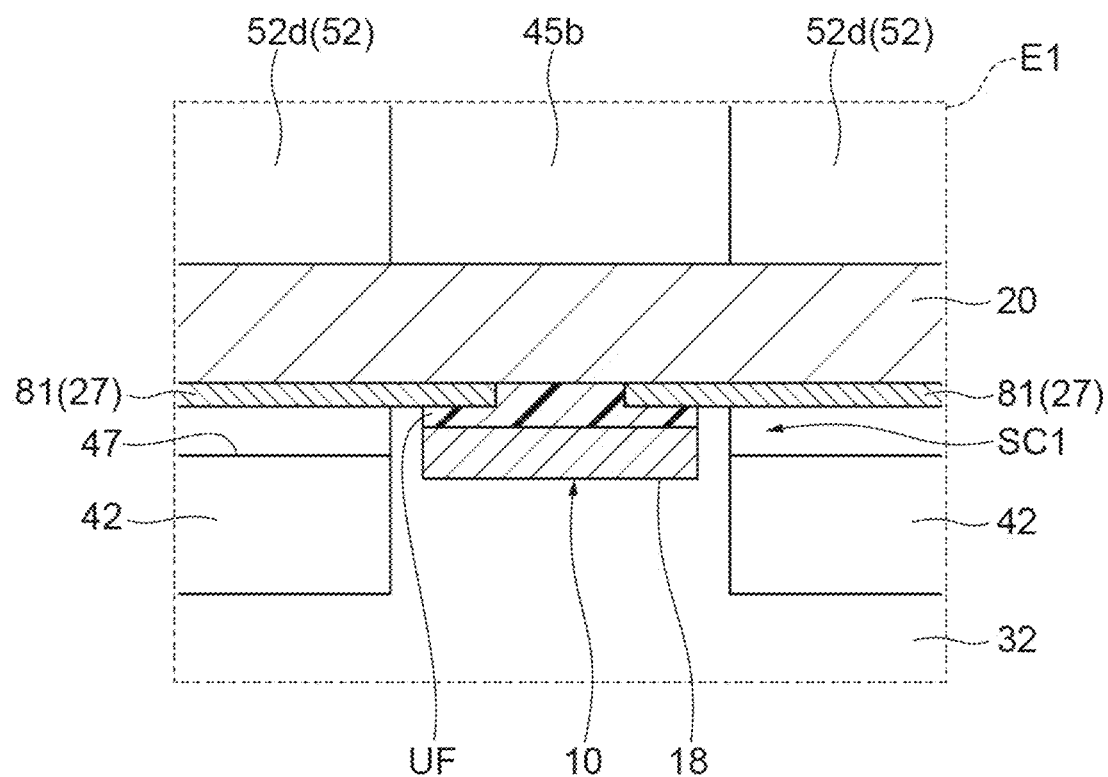
FIG. 3 is an enlarged view of a region E1 in FIG. 2(b).
Figure 4:
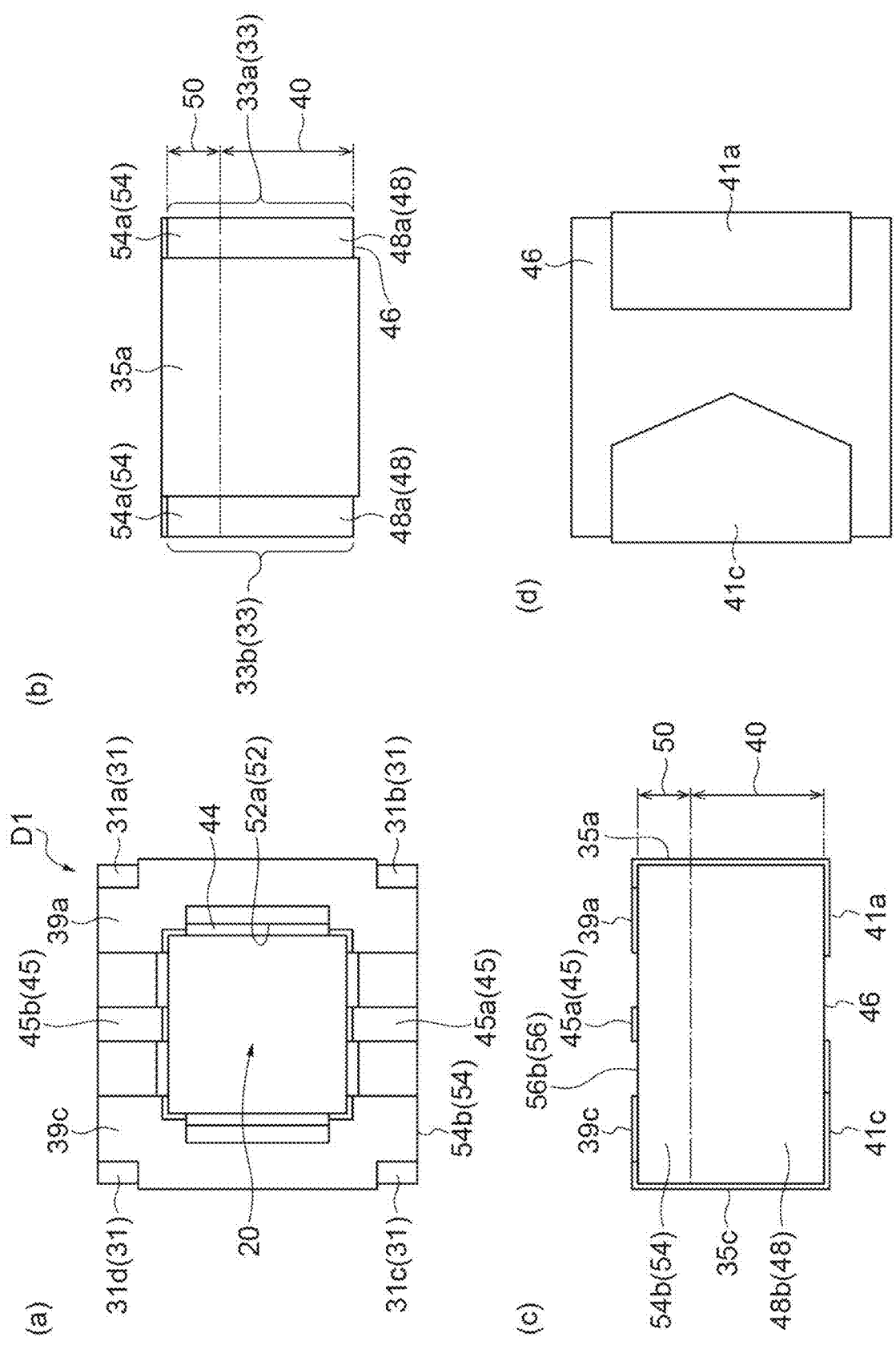
FIG. 4(a) is a plan view of the light-emitting device according to the first embodiment.
FIG. 4(b) is a side view of the light-emitting device according to the first embodiment.
FIG. 4(c) is a front view of the light-emitting device according to the first embodiment.
FIG. 4(d) is a bottom view of the light-emitting device according to the first embodiment.

A configuration of a light-emitting device D1 according to a first embodiment will be described with reference to FIGS. 1 to 6. FIG. 1(a) is a view schematically illustrating a configuration of a light-emitting device according to a first embodiment, and FIG. 1(b) is an enlarged view of a light source in FIG. 1(a). FIG. 2(a) is a plan view of the light-emitting device according to the first embodiment, and FIG. 2(b) is a cross-sectional view taken along line a IIb-IIb in FIG. 2(a). FIG. 3 is an enlarged view of a region E1 in FIG. 2(b). FIG. 4(a) is a plan view of the light-emitting device according to the first embodiment, and FIG. 4(b) is a side view of the light-emitting device according to the first embodiment. FIG. 4(c) is a front view of the light-emitting device according to the first embodiment, and FIG. 4(d) is a bottom view of the light-emitting device according to the first embodiment. FIG. 5(a) is a plan view of a package according to the first embodiment, and FIG. 5(b) is a cross-sectional view taken along line a Vb-Vb in FIG. 5(a).

FIG. 6(a) is a plan view of a window according to the first embodiment, and FIG. 6(b) is a front view of the window according to the first embodiment.

The light-emitting device D1 includes a light source 10, a window 20, and a package 30. The window 20 is mounted with the light source 10. The package 30 defines a space SC1 with the window 20. The light source 10 is disposed in the space SC1.

The light source 10 includes a light-emitting element. In the present embodiment, the light-emitting element includes a light-emitting diode (LED). The light-emitting diode used in the light-emitting element emits light in an infrared region having wavelengths of 3 to 5 μm, for example. The light source 10 has, for example, a surface mounting type rectangular parallelepiped shape or a substantially cubic shape. In the light source 10, for example, one of six surfaces having a rectangular parallelepiped shape is a terminal surface 12, and an anode terminal 14 and a cathode terminal 16 are disposed on the terminal surface 12, for example. The light source 10 includes a radiation surface 18 on the opposite side of the terminal surface 12, and light is emitted from the radiation surface 18.

The window 20 includes a window base 21 and an electrically conductive body WD1. The window base 21 includes a light exit surface 22, a lower surface 23, and a side surface 24. The lower surface 23 opposes the light exit surface 22. The side surface 24 couples the light exit surface 22 and the lower surface 23. The electrically conductive body WD1 is disposed on the lower surface 23 of the window base 21. The coupling between the light exit surface 22 and the lower surface 23 includes a configuration in which the light exit surface 22 and the lower surface 23 are directly coupled and a configuration in which the light exit surface 22 and the lower surface 23 are indirectly coupled with another surface interposed therebetween. Hereinafter, in this specification, coupling between surfaces includes direct coupling and indirect coupling.

The package 30 includes a base portion 40 and a wall portion 50, and the wall portion 50 is positioned on the base portion 40, for example. The base portion 40 includes a recess 42, a placement surface 44, a bottom surface 46, and an outer side surface 48. The recess 42 is formed to open toward the lower surface 23 of the window base 21. The placement surface 44 is disposed along an edge 47 of the recess 42 and opposes the lower surface 23 of the window base 21. The bottom surface 46 opposes the placement surface 44. The outer side surface 48 is coupled to the bottom surface 46.

The wall portion 50 includes an inner wall surface 52, an outer wall surface 54, and an upper wall surface 56, and is disposed along the window base 21 when viewed from a direction Ax1 orthogonal to the light exit surface 22. The inner wall surface 52 is coupled to the placement surface 44 and opposes the side surface 24 of the window 20. The outer wall surface 54 opposes the inner wall surface 52 and is coupled to the outer side surface 48. The upper wall surface 56 couples the inner wall surface 52 and the outer wall surface 54.

The package 30 may have a polygonal shape when viewed from the direction Ax1 orthogonal to the light exit surface 22. The package 30 has, for example, a quadrangular shape including a square shape and a rectangular shape, a hexagonal shape, or an octagonal shape. The number of each of the outer side surfaces 48 and the outer wall surfaces 54 may be plural. The number of each of the outer side surfaces 48 and the outer wall surfaces 54 is, for example, four, six, or eight.

The package 30 includes a reflection portion 32 and an electric conductor 34. The reflection portion 32 is disposed on a surface 43 of the recess 42. In the light-emitting device D1, light is emitted from the radiation surface 18 of the light source 10 to the reflection portion 32, and the reflection portion 32 reflects the light emitted from the light source 10 to the window 20. The light reflected on the reflection portion 32 is transmitted through the window base 21 of the window 20 and emitted to the outside of the light-emitting device D1. The electric conductor 34 is disposed on the placement surface 44, the inner wall surface 52, the upper wall surface 56, the outer wall surface 54, and the outer side surface 48.

The window base 21 is made of a material suitable for transmitting the light reflected on the reflection portion 32. This material includes, for example, silicon (Si), sapphire, and germanium. Among the materials of the window base 21, the silicon substrate has a high thermal conductivity of about 150 W/(mK), and favorably transmits infrared light having a wavelength region of, for example, 3 to 5 μm. The silicon substrate may include, on the substrate, an antireflection film that effectively reduces reflection of infrared light having wavelengths of 3 to 5 μm. The silicon substrate disposed with the antireflection film has high light transmittance at wavelengths of 3 to 5 μm, for example, in addition to high thermal conductivity.

The electrically conductive body WD1 on the window base 21 includes a plurality of first pads 25 and connectors CN1. The plurality of first pads 25 oppose the placement surface 44. The connectors CN1 electrically connect the light source 10 and the plurality of first pads 25. In the present embodiment, each connector CN1 includes, for example, a third pad 26 and an electrically conductive line 27. The light source 10 is mounted through the third pad 26. The electrically conductive line 27 connects the first pad 25 and the third pad 26. The third pad 26 is disposed on a region where the light source 10 is mounted on the window base 21, for example, a central region of the window base 21. The plurality of first pads 25 are disposed, for example, in a peripheral region surrounding the central region.

The third pad 26 may include one or a plurality of pads. The third pad 26 includes, for example, a first mounting pad body 61 and a second mounting pad body 62. One of the plurality of third pads 26 is connected to the anode terminal 14 or the cathode terminal 16 of the light source 10. For example, the first mounting pad body 61 and the second mounting pad body 62 are connected to the anode terminal 14 and the cathode terminal 16 of the light source 10, respectively.

The material of the third pad 26 includes, for example, metal plating containing Cu—Ni—Au and a solder. The solder may be disposed on Cu—Ni—Au. A Au layer is positioned as the uppermost layer of the metal-plated Cu—Ni—Au. The material of the first pad 25 and the electrically conductive line 27 is metal plating containing Cu—Ni—Au, Al—Ni—Au, and Ti—Pt—Au. The Au layer is positioned on the uppermost layer of the metal plating.

The window 20 includes a dummy pad 28 disposed on the lower surface 23. The light source 10 is mounted on the dummy pad 28. The dummy pad 28 may include one or a plurality of pads. The dummy pad 28 may include, for example, a first dummy pad body 71 and a second dummy pad body 72. The first dummy pad body 71 and the second dummy pad body 72 support the light source 10 together with the first mounting pad body 61 and the second mounting pad body 62. In the present embodiment, the first dummy pad body 71 and the second dummy pad body 72 support the light source 10, but are not electrically connected to the light source 10. The dummy pad 28 may be made of the same material as the third pad 26.

For example, the first mounting pad body 61, the second mounting pad body 62, the first dummy pad body 71, and the second dummy pad body 72 may be positioned in this order at respective vertexes of a quadrangle virtually drawn in a region of the lower surface 23 where the light source 10 is mounted.

In the present embodiment, the plurality of third pads 26 include two pad bodies, that is, the first mounting pad body 61 and the second mounting pad body 62, and the plurality of dummy pads 28 include two dummy pad bodies, that is, the first dummy pad body 71 and the second dummy pad body 72. In the light-emitting device, the number of pad bodies included in the third pad 26 and the dummy pad 28 is not particularly limited, in a case where power is supplied to the light source 10 and the light source 10 is stably supported. For example, the number of pad bodies included in the third pad 26 may be two, and the number of pad bodies included in the dummy pad 28 may be one. The number of pad bodies included in the third pad 26 may be two, and the number of pad bodies included in the dummy pad 28 may be three.

The window base 21 has, for example, a shape like a flat plate, and may have a substantially square shape in plan view. The window base 21 includes, for example, a first side portion 21a, a second side portion 21b, a third side portion 21c, and a fourth side portion 21d. The first side portion 21a is positioned on the opposite side of the third side portion 21c. The second side portion 21b is positioned on the opposite side of the fourth side portion 21d.

The window base 21 includes, for example, four corner portions. The window base 21 includes a first corner portion 29a defined by the fourth side portion 21d and the first side portion 21a, and includes a second corner portion 29b defined by the first side portion 21a and the second side portion 21b. The window base 21 includes a third corner portion 29c defined by the second side portion 21b and the third side portion 21c, and includes a fourth corner portion 29d defined by the third side portion 21c and the fourth side portion 21d.

The first pad 25 includes, for example, a first pad body 63 and a second pad body 64. The first pad 25 is disposed in, for example, a peripheral region. For example, the first pad body 63 is disposed from the first corner portion 29a to the second corner portion 29b on the first side portion 21a. For example, the second pad body 64 is disposed from the third corner portion 29c to the fourth corner portion 29d on the third side portion 21c.

The first pad body 63 includes, for example, a first connection portion 63a and a second connection portion 63b. The first connection portion 63a is positioned at one end edge of the first pad body 63. The second connection portion 63b is positioned at another end edge of the first pad body 63. The first connection portion 63a is disposed, for example, at the first corner portion 29a. The second connection portion 63b is disposed, for example, at the second corner portion 29b. The first connection portion 63a and the second connection portion 63b connect the first pad body 63 and the electric conductor disposed in the package 30.

The second pad body 64 includes, for example, a third connection portion 64a and a fourth connection portion 64b. The third connection portion 64a is positioned at one end edge of the second pad body 64. The fourth connection portion 64b is positioned at another end edge of the second pad body 64. The third connection portion 64a is disposed, for example, at the third corner portion 29c. The fourth connection portion 64b is disposed, for example, at the fourth corner portion 29d. The third connection portion 64a and the fourth connection portion 64b connect the second pad body 64 and the electric conductor disposed in the package 30.

In the present embodiment, the window 20 includes an underfill UF. The underfill UF is disposed to fill a gap generated between the lower surface 23, the third pad 26, the dummy pad 28, and the light source 10.

The electrically conductive line 27 may be one or more. The electrically conductive line 27 electrically connects the first pad 25 and the third pad 26 corresponding to each other. The plurality of electrically conductive lines 27 include, for example, a first electrically conductive line 81 and a second electrically conductive line 82. The first electrically conductive line 81 electrically connects the first mounting pad body 61 and the first pad body 63, for example. The second electrically conductive line 82 electrically connects the second mounting pad body 62 and the second pad body 64, for example.

The first electrically conductive line 81 is connected to the first pad body 63 and the first mounting pad body 61. For example, one end edge of the first electrically conductive line 81 is connected to the first pad body 63 to cross the first pad body 63. For example, another end edge of the first electrically conductive line 81 is connected to the first mounting pad body 61. The one end edge of the first electrically conductive line 81 and the first pad body 63 intersect, for example, near the center of the first pad body 63. The other end edge of the first electrically conductive line 81 is positioned, for example, between the window base 21 and the first mounting pad body 61 in the direction Ax1.

The second electrically conductive line 82 is connected to the second pad body 64 and the second mounting pad body 62. For example, one end edge of the second electrically conductive line 82 is connected to the second pad body 64 to cross the second pad body 64. For example, another end edge of the second electrically conductive line 82 is connected to the second mounting pad body 62. The one end edge of the second electrically conductive line 82 and the second pad body 64 intersect, for example, near the center of the second pad body 64. The other end edge of the second electrically conductive line 82 is positioned, for example, between the window base 21 and the second mounting pad body 62 in the direction Ax1.

The outer side surface 48 of the package 30 includes, for example, a first outer side surface 48a, a second outer side surface 48b, a third outer side surface 48c, and a fourth outer side surface 48d. The first outer side surface 48a opposes the third outer side surface 48c. The second outer side surface 48b opposes the fourth outer side surface 48d. The first outer side surface 48a connects the fourth outer side surface 48d and the second outer side surface 48b. The second outer side surface 48b connects the first outer side surface 48a and the third outer side surface 48c. The third outer side surface 48c connects the second outer side surface 48b and the fourth outer side surface 48d, and the fourth outer side surface 48d connects the third outer side surface 48c and the first outer side surface 48a. The first outer side surface 48a, the second outer side surface 48b, the third outer side surface 48c, and the fourth outer side surface 48d are coupled to the bottom surface 46.

The outer wall surface 54 includes, for example, a first outer wall surface 54a, a second outer wall surface 54b, a third outer wall surface 54c, and a fourth outer wall surface 54d. The first outer wall surface 54a opposes the third outer wall surface 54c. The second outer wall surface 54b opposes the fourth outer wall surface 54d. The first outer wall surface 54a connects the fourth outer wall surface 54d and the second outer wall surface 54b. The second outer wall surface 54b connects the first outer wall surface 54a and the third outer wall surface 54c. The third outer wall surface 54c connects the second outer wall surface 54b and the fourth outer wall surface 54d. The fourth outer wall surface 54d connects the third outer wall surface 54c and the first outer wall surface 54a.

The first outer side surface 48a is coupled to the first outer wall surface 54a. The second outer side surface 48b is coupled to the second outer wall surface 54b. The third outer side surface 48c is coupled to the third outer wall surface 54c. The fourth outer side surface 48d is coupled to the fourth outer wall surface 54d.

The inner wall surface 52 includes, for example, a first inner wall surface 52a, a second inner wall surface 52b, a third inner wall surface 52c, and a fourth inner wall surface 52d. The first inner wall surface 52a opposes the third inner wall surface 52c. The second inner wall surface 52b opposes the fourth inner wall surface 52d. The first inner wall surface 52a connects the fourth inner wall surface 52d and the second inner wall surface 52b. The second inner wall surface 52b connects the first inner wall surface 52a and the third inner wall surface 52c. The third inner wall surface 52c connects the second inner wall surface 52b and the fourth inner wall surface 52d. The fourth inner wall surface 52d connects the third inner wall surface 52c and the first inner wall surface 52a. The first inner wall surface 52a, the second inner wall surface 52b, the third inner wall surface 52c, and the fourth inner wall surface 52d are coupled to the mounting surface 44. The first inner wall surface 52a opposes the first outer wall surface 54a. The second inner wall surface 52b opposes the second outer wall surface 54b. The third inner wall surface 52c opposes the third outer wall surface 54c. The fourth inner wall surface 52d opposes the fourth outer wall surface 54d.

The upper wall surface 56 includes, for example, a first upper wall surface 56a, a second upper wall surface 56b, a third upper wall surface 56c, and a fourth upper wall surface 56d. The first upper wall surface 56a is positioned on the opposite side of the third upper wall surface 56c. The second upper wall surface 56b is positioned on the opposite side of the fourth upper wall surface 56d. The first upper wall surface 56a connects the first inner wall surface 52a and the first outer wall surface 54a. The second upper wall surface 56b connects the second inner wall surface 52b and the second outer wall surface 54b. The third upper wall surface 56c connects the third inner wall surface 52c and the third outer wall surface 54c. The fourth upper wall surface 56d connects the fourth inner wall surface 52d and the fourth outer wall surface 54d.

The electric conductor 34 includes a plurality of second pads 36. The plurality of second pads 36 are disposed on the placement surface 44 to oppose the corresponding first pads 25 of the plurality of first pads 25. The plurality of second pads 36 are electrically connected to the corresponding first pads 25.

The placement surface 44 includes, for example, four corners. For example, the placement surface 44 includes a first corner 44a. The first corner 44a is defined by the placement surface 44, the fourth inner wall surface 52d, and the first inner wall surface 52a. The placement surface 44 includes a second corner 44b. The second corner 44b is defined by the placement surface 44, the first inner wall surface 52a, and the second inner wall surface 52b. The placement surface 44 includes a third corner 44c. The third corner 44c is defined by the placement surface 44, the second inner wall surface 52b, and the third inner wall surface 52c. The placement surface 44 includes a fourth corner 44d. The fourth corner 44d is defined by the placement surface 44, the third inner wall surface 52c, and the fourth inner wall surface 52d.

In the present embodiment, for example, the second pads 36 of the electric conductor 34 are disposed at the four corners. The second pad 36 is electrically connected to a connection portion of each pad body disposed on the window 20. For example, the second pads 36 include a first electric conductor 37a, a second electric conductor 37b, a third electric conductor 37c, and a fourth electric conductor 37d at the corners. The first electric conductor 37a is disposed on the first corner 44a. The first electric conductor 37a is electrically connected to the fourth connection portion 64b of the second pad body 64. The second electric conductor 37b is disposed on the second corner 44b. The second electric conductor 37b is electrically connected to the third connection portion 64a of the second pad body 64. The third electric conductor 37c is disposed on the third corner 44c. The third electric conductor 37c is electrically connected to the second connection portion 63b of the first pad body 63. The fourth electric conductor 37d is disposed on the fourth corner 44d. The fourth electric conductor 37d is electrically connected to the first connection portion 63a of the first pad body 63.

The fourth connection portion 64b of the second pad body 64 of the window 20 is electrically connected to the first electric conductor 37a of the placement surface 44 through an electrically conductive resin. The third connection portion 64a of the second pad body 64, and the second connection portion 63b and the first connection portion 63a of the first pad body 63 in the window 20 are electrically connected to the second electric conductor 37b, the third conductor 37c, and the fourth electric conductor 37d of the placement surface 44, respectively, through an electrically conductive resin.

The electric conductor 34 includes, for example, a first inner electric conductor 38a, a second inner electric conductor 38b, a third inner electric conductor 38c, and a fourth inner electric conductor 38d on the inner wall surface 52. For example, the package 30 includes, on the inner wall surface 52, a first edge portion defined by the fourth inner wall surface 52d and the first inner wall surface 52a, and a second edge portion defined by the first inner wall surface 52a and the second inner wall surface 52b. The first inner electric conductor 38a is disposed on the first edge portion. The first inner electric conductor 38a is electrically connected to the first electric conductor 37a. The second inner electric conductor 38b is disposed on the second edge portion. The second inner electric conductor 38b is electrically connected to the second electric conductor 37b.

The package 30 includes a third edge portion defined by the second inner wall surface 52b and the third inner wall surface 52c, and a fourth edge portion defined by the third inner wall surface 52c and the fourth inner wall surface 52d on the inner wall surface 52. The third inner electric conductor 38c electrically connected to the third electric conductor 37c is disposed on the third edge portion. The fourth inner electric conductor 38d electrically connected to the fourth electric conductor 37d is disposed on the fourth edge portion.

The package 30 includes a corner portion 31 defined by the upper wall surface 56 and the outer wall surfaces 54 adjacent to each other. For example, in a case where the package 30 has a quadrangular shape when viewed from the direction Ax1 orthogonal to the light exit surface 22, the package 30 includes four corner portions 31. On the upper wall surface 56, the package 30 includes a first corner portion 31a defined by the upper wall surface 56, the fourth outer wall surface 54d, and the first outer wall surface 54a. On the upper wall surface 56, the package 30 includes a second corner portion 31b defined by the upper wall surface 56, the first outer wall surface 54a, and the second outer wall surface 54b. On the upper wall surface 56, the package 30 includes a third corner portion 31c defined by the upper wall surface 56, the second outer wall surface 54b, and the third outer wall surface 54c. On the upper wall surface 56, the package 30 includes a fourth corner portion 31d defined by the upper wall surface 56, the third outer wall surface 54c, and the fourth outer wall surface 54d.

The electric conductor 34 includes, for example, a first upper electric conductor 39a and a third upper electric conductor 39c on the upper wall surface 56. The first upper electric conductor 39a is disposed on the first upper wall surface 56a, the second upper wall surface 56b, and the fourth upper wall surface 56d except for the first corner portion 31a and the second corner portion 31b. The third upper electric conductor 39c is disposed on the second upper wall surface 56b, the third upper wall surface 56c, and the fourth upper wall surface 56d except for the third corner portion 31c and the fourth corner portion 31d. The electric conductor 34 is not disposed on the corner portion 31.

The first upper electric conductor 39a may be disposed in a region of 50% or more of an area of the first upper wall surface 56a on the first upper wall surface 56a. The third upper electric conductor 39c may be disposed in a region of 50% or more of an area of the third upper wall surface 56c on the third upper wall surface 56c. The electric conductor 34 may be disposed on the upper wall surface 56 such that the ratio of an area of the electric conductor 34 to an area of the upper wall surface 56 is 50% or more.

In the present embodiment, the first upper electric conductor 39a is not disposed in an inner region 56s of the first upper wall surface 56a. The first upper electric conductor 39a may be disposed in the inner region 56s. In the present embodiment, the third upper electric conductor 39c is not disposed in an inner region 56t of the third upper wall surface 56c. The second upper electric conductor 39b may be disposed in the inner region 56t.

The package 30 includes a ridge portion 33 defined by the outer wall surfaces 54 adjacent to each other. For example, in a case where the package 30 includes a quadrangular shape when viewed from the direction Ax1 orthogonal to the light exit surface 22, the package 30 includes four ridge portions 33. On the outer wall surface 54, the package 30 includes a first ridge portion 33a defined by the fourth outer wall surface 54d and the first outer wall surface 54a. On the outer wall surface 54, the package 30 includes a second ridge portion 33b defined by the first outer wall surface 54a and the second outer wall surface 54b. On the outer wall surface 54, the package 30 includes a third ridge portion 33c defined by the second outer wall surface 54b and the third outer wall surface 54c. On the outer wall surface 54, the package 30 includes a fourth ridge portion 33d defined by the third outer wall surface 54c and the fourth outer wall surface 54d. These ridge portions 33 are disposed, for example, from the boundary between the upper wall surface 56 and the outer wall surface 54 to the boundary between the outer side surface 48 and the bottom surface 46.

The package 30 includes a first outer electric conductor 35a disposed on the first outer wall surface 54a and the first outer side surface 48a. The package 30 includes a third outer electric conductor 35c on the third outer wall surface 54c and the third outer side surface 48c. The first outer electric conductor 35a is electrically connected to the first upper electric conductor 39a. The third outer electric conductor 35c is electrically connected to the third upper electric conductor 39c. The first outer electric conductor 35a is not disposed on the first ridge portion 33a and the second ridge portion 33b. The third outer electric conductor 35c is not disposed on the third ridge portion 33c and the fourth ridge portion 33d. The electric conductor 34 is not disposed on the ridge portion 33.

The first outer electric conductor 35a may be disposed in a region of 50% or more of an area of the first outer wall surface 54a on the first outer wall surface 54a. The third outer electric conductor 35c may be disposed in a region of 50% or more of an area of the third outer wall surface 54c on the third outer wall surface 54c. The electric conductor 34 may be disposed on the outer wall surface 54 such that the ratio of the area of the electric conductor 34 to an area of the outer wall surface 54 is 50% or more.

The first outer electric conductor 35a may be disposed in a region of 50% or more of a sum of the area of the first outer wall surface 54a and an area of the first outer side surface 48a on the first outer wall surface 54a and the first outer side surface 48a. The third outer electric conductor 35c may be disposed in a region of 50% or more of a total area of an area of the third outer wall surface 54c and an area of the third outer side surface 48c on the third outer wall surface 54c and the third outer side surface 48c. The electric conductor 34 may be disposed on the outer wall surface 54 and the outer side surface 48 such that the ratio of the area of the electric conductor 34 to the sum of the area of the outer wall surface 54 and an area of the outer side surface 48 is 50% or more.

The package 30 includes, for example, a first bottom electric conductor 41a and a third bottom electric conductor 41c on the bottom surface 46. The electric conductor may be further disposed over the bottom surface 46. The first bottom electric conductor 41a may be one of an anode electrode and a cathode electrode. The third bottom electric conductor 41c may be the other of the anode electrode and the cathode electrode. The first bottom electric conductor 41a is electrically connected to the first outer electric conductor 35a. The third bottom electric conductor 41c is electrically connected to the third outer electric conductor 35c.

The first bottom electric conductor 41a may have a two-dimensional shape such as a rectangular shape. The third bottom electric conductor 41c may have a two-dimensional shape in which a rectangular shape and a triangular shape are integrated. Due to the difference in these two-dimensional shapes, the anode electrode and the cathode electrode are easily identified visually.

The package 30 includes a reflection portion electric conductor 45. The reflection portion electric conductor 45 is disposed on the recess 42, the placement surface 44, the inner wall surface 52, and the upper wall surface 56. The reflection portion electric conductor 45 includes, for example, a first reflection portion electric conductor 45a and a second reflection portion electric conductor 45b. The second reflection portion electric conductor 45b is disposed to oppose the first reflection portion electric conductor 45a.

The first reflection portion electric conductor 45a is disposed on the recess 42, the placement surface 44, the second inner wall surface 52b, and the second upper wall surface 56b. The second reflection portion electric conductor 45b is disposed on the recess 42, the placement surface 44, the fourth inner wall surface 52d, and the fourth upper wall surface 56d. Both the first reflection portion electric conductor 45a and the second reflection portion electric conductor 45b are disposed on the recess 42 and are electrically connected to the upper end of the reflection portion 32 disposed on the recess 42. The first reflection portion electric conductor 45a and the second reflection portion electric conductor 45b are made of, for example, electrically conductive materials obtained at the time of forming the reflection portion 32 including metal plating. The reflection portion 32 includes metal plating containing Cu—Ni—Au. In the present embodiment, the Au layer is positioned on the uppermost layer of the metal plating.

The edge 47 of the recess 42 defines a boundary with the placement surface 44. The edge 47 has, for example, a substantially circular shape when viewed from the direction Ax1 orthogonal to the light exit surface 22. The shape of the edge 47 may be a substantially circular shape or may be any shape as long as the light from the light source 10 is reflected on the reflection portion 32 to the window 20. The shape of the edge 47 may be, for example, an elliptical shape or a quadrangular shape including a square shape and a rectangular shape when viewed from the direction Ax1. The shape of the edge 47 viewed from the direction Ax1 may be a polygon including a pentagon.

The recess 42 includes an edge portion 49 along the edge 47 on the surface 43. The edge portion 49 includes the edge 47. The reflection portion 32 is not disposed on the edge portion 49 but is disposed on the surface 43 of the recess 42 excluding the edge portion 49. The first reflection portion electric conductor 45a and the second reflection portion electric conductor 45b are also disposed on the edge portion 49, and are disposed from the upper end edge of the reflection portion 32 to the upper wall surface 56.

The reflection portion 32 has a cross-sectional shape corresponding to the surface 43 of the recess 42. The reflecting portion 32 may have any cross-sectional shape as long as it reflects light from the light source portion 10 to the window portion 20. The reflection portion 32 has, for example, an elliptical shape or a parabolic shape. According to these shapes, the beam of the light reflected on the reflection portion 32 is, for example, a focused beam. If necessary, the beam of the light reflected on the reflection portion 32 may be a parallel beam or a diffused beam. In addition to the elliptical shape or the parabolic shape, the cross-sectional shape of the reflection portion 32 may have another shape in which the light from the light source 10 is reflected to the window 20, for example. The other shape may be formed by combining a plurality of planar shapes.

In the present embodiment, the package 30 is made of, for example, a ceramic or a PPA resin. The electric conductor 34 is made of, metal plating. The metal plating is, for example, Cu—Ni—Au plating. In the present embodiment, the Au layer is positioned on the uppermost layer of the metal plating.

In the light-emitting device D1, a height from the placement surface 44 to the upper wall surface 56 may be larger than a height from the placement surface 44 to the light exit surface 22. The height from the placement surface 44 to the upper wall surface 56 may be about the same as the height from the placement surface 44 to the light exit surface 22. The height from the placement surface 44 to the upper wall surface 56 may be smaller than the height from the placement surface 44 to the light exit surface 22.

In the light-emitting device D1, the light source 10 mounted on the window 20 emits light to the reflection portion 32 disposed in the recess 42 opposing the lower surface 23 of the window base 21. The reflection portion 32 reflects the light to the window 20. The window 20 transmits the light reflected on the reflection portion 32 toward the outside. The reflection portion 32 is disposed on the surface 43 of the recess 42, and the light to be reflected is focused due to the recessed shape of the reflection portion 32. As a result, the light transmitted through the window 20 has an improved light density, and the improved light density provides the light-emitting device D1 for analyzing the environmental gas with high sensitivity.

In the light-emitting device D1, the light source 10 is electrically connected to the plurality of first pads 25 through a plurality of connectors CN1. The plurality of first pads 25 are electrically connected to the electric conductor 34 through the corresponding second pads 36. The light source 10 is electrically connected to the electric conductor 34 through the first pad 25 and the second pad 36. The electric conductor 34 is disposed on the placement surface 44, the inner wall surface 52, the upper wall surface 56, the outer wall surface 54, and the outer side surface 48. This disposal of the electric conductor 34 provides a large area in contact with the outside of the light-emitting device D1. The heat generated in the light source 10 due to the supply of power is effectively dissipated through the electric conductor 34 having the large area in contact with the outside.

In the present embodiment, for example, the light source 10 is supported with the four pads, that is, the first mounting pad body 61, the second mounting pad body 62, the first dummy pad body 71, and the second dummy pad body 72. The light source 10 is stably mounted on the pad. The heat generated from the light source 10 is efficiently conducted to the electrically conductive body WD1 particularly through the first mounting pad body 61 and the second mounting pad body 62.

In the light-emitting device D1, the electric conductor 34 is further disposed on the bottom surface 46. Therefore, this disposal further increases the area where the electric conductor 34 is in contact with the outside of the light-emitting device D1. As a result, the light-emitting device D1 further improves heat dissipation through the electric conductor 34.

In the present embodiment, the thickness of the electric conductor 34 is, for example, 100 Å to 100 μm. In a case where the electric conductor 34 has a thickness in this range, the heat dissipation through the electric conductor 34 is further increased. The thickness of the electric conductor 34 may be, for example, 1 μm to 30 μm. In a case where the electric conductor 34 has a thickness in this range, the heat dissipation through the electric conductor 34 is further increased.

In the present embodiment, the thermal conductivity of the electric conductor 34 is, for example, 50 to 500 W/(mK). In a case where the electric conductor 34 has a thermal conductivity in this range, the heat dissipation through the electric conductor 34 is further increased. The thermal conductivity of the electric conductor 34 may be, for example, 300 to 450 W/(mK). In a case where the electric conductor 34 has a thermal conductivity in this range, the heat dissipation through the electric conductor 34 is further increased.

In the light-emitting device D1, the height from the placement surface 44 to the upper wall surface 56 is larger than the height from the placement surface 44 to the light exit surface 22. Therefore, in the configuration in which the height from the placement surface 44 to the upper wall surface 56 is larger than the height from the placement surface 44 to the light exit surface 22, the wall portion disposed along the window base 21 prevents the window base 21 from coining into contact with an external object of the light-emitting device D1. Damage to the window base 21 is reduced, and thus the window base 21 favorably transmits the light reflected on the reflection portion 32 toward the outside. On the inner wall surface 52, the electric conductor 34 is disposed in a region from the placement surface 44 to the upper wall surface 56. Therefore, this disposal further improves the heat dissipation through the electric conductor 34. For example, in a light-emitting device including an LED, generally, the size of the electric conductor tends to be reduced from the viewpoint of reducing the generation of noise. But, in the light-emitting device D1 of the present embodiment, the electric conductor 34 is disposed in the region from the placement surface 44 to the upper wall surface 56 to improve the heat dissipation through the electric conductor 34.

In the light-emitting device D1, the electric conductor 34 is disposed on the upper wall surface 56 such that the ratio of the area of the electric conductor 34 to the area of the upper wall surface 56 is 50% or more. Therefore, the heat dissipation through the electric conductor 34 is enhanced in the light-emitting device D1.

In the light-emitting device D1, the electric conductor 34 is disposed on the outer wall surface 54 such that the ratio of the area of the electric conductor 34 to the area of the outer wall surface 54 is 50% or more. Therefore, the heat dissipation through the electric conductor 34 is further enhanced in the light-emitting device D1.

In the light-emitting device D1, the electric conductor 34 is disposed on the outer wall surface 54 and the outer side surface 48 such that the ratio of the area of the electric conductor 34 to the sum of the area of the outer wall surface 54 and the area of the outer side surface 48 is 50% or more. Therefore, the heat dissipation through the electric conductor 34 is further enhanced in the light-emitting device D1.

In the light-emitting device D1, the electric conductor 34 is not disposed to the corner portion 31 and the ridge portion 33 of the package 30. Therefore, peeling of the electric conductor 34 starting from the corner portion 31 and the ridge portion 33 is reduced in the light-emitting device D1.

In the light-emitting device D1, the light source 10 is stably mounted on the window 20 through the dummy pad 28. The dummy pad 28 mounts the light source 10, and thus the dummy pad 28 efficiently receives and dissipates the heat generated in the light source 10.

In the light-emitting device D1, each of the connectors CN1 include the third pad 26 mounting the light source 10, and the electrically conductive line 27 electrically connecting the first pad 25 and the third pad 26. The light source 10 is mounted through the third pad 26, and the first pad 25 and the third pad 26 are electrically connected through the electrically conductive line 27. The light source 10 is mounted on the third pad 26, and is electrically connected to the first pad 25.

In the light-emitting device D1, the silicon substrate of the window base 21 has high thermal conductivity. The window base 20 increases thermal conduction to the electric conductor 34. This increase of thermal conduction enables a decrease in the area of the electrically conductive body WD1. In a case where the area of the electrically conductive body WD1 is decreased, the electrically conductive body WD1 decreases an amount of the light from the reflection portion 32 blocked through the electrically conductive body WD1 itself.

Figure 7:
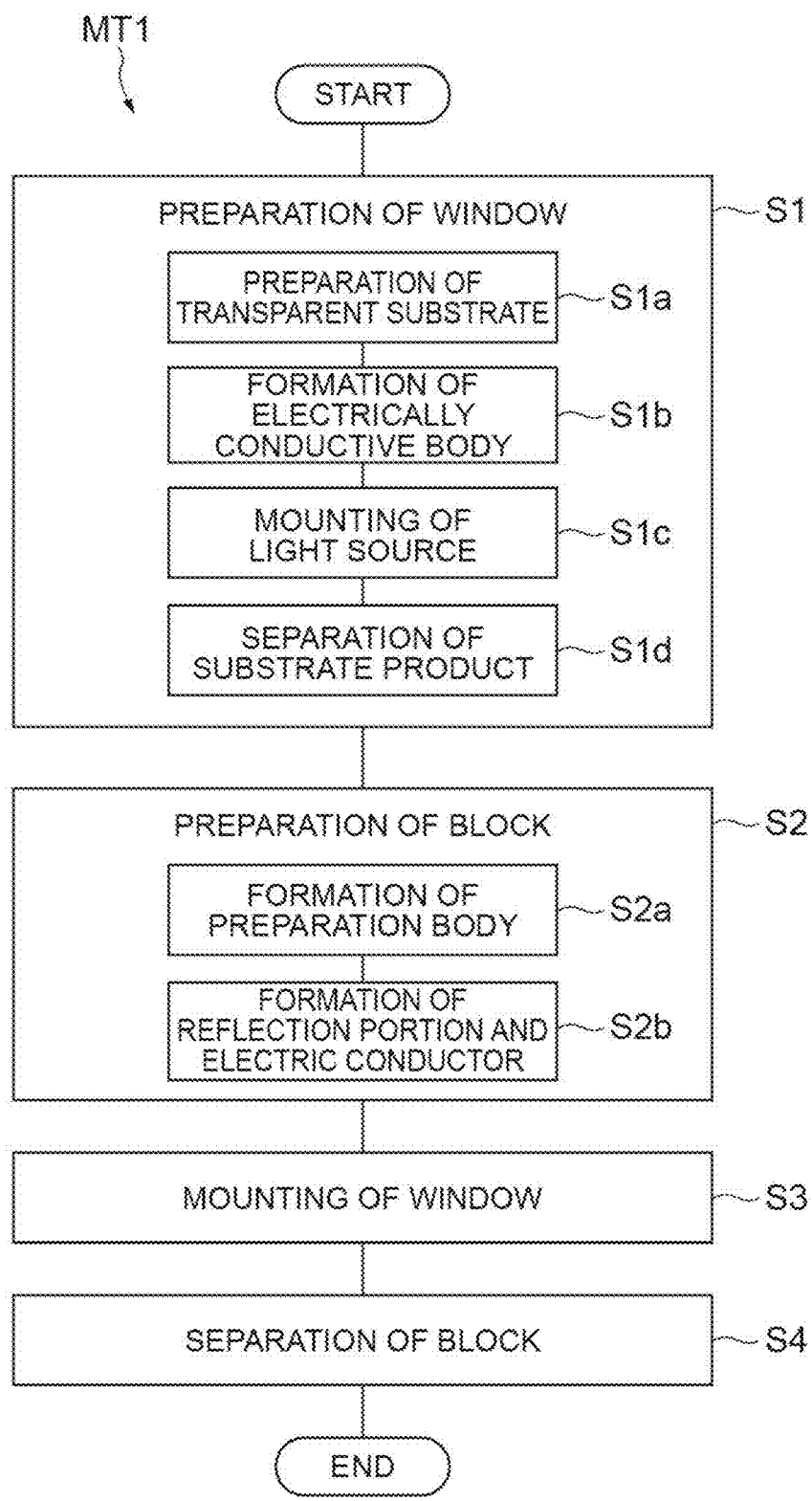
FIG. 7 is a flowchart illustrating a method for making the light-emitting device according to the first embodiment.
Figure 9:
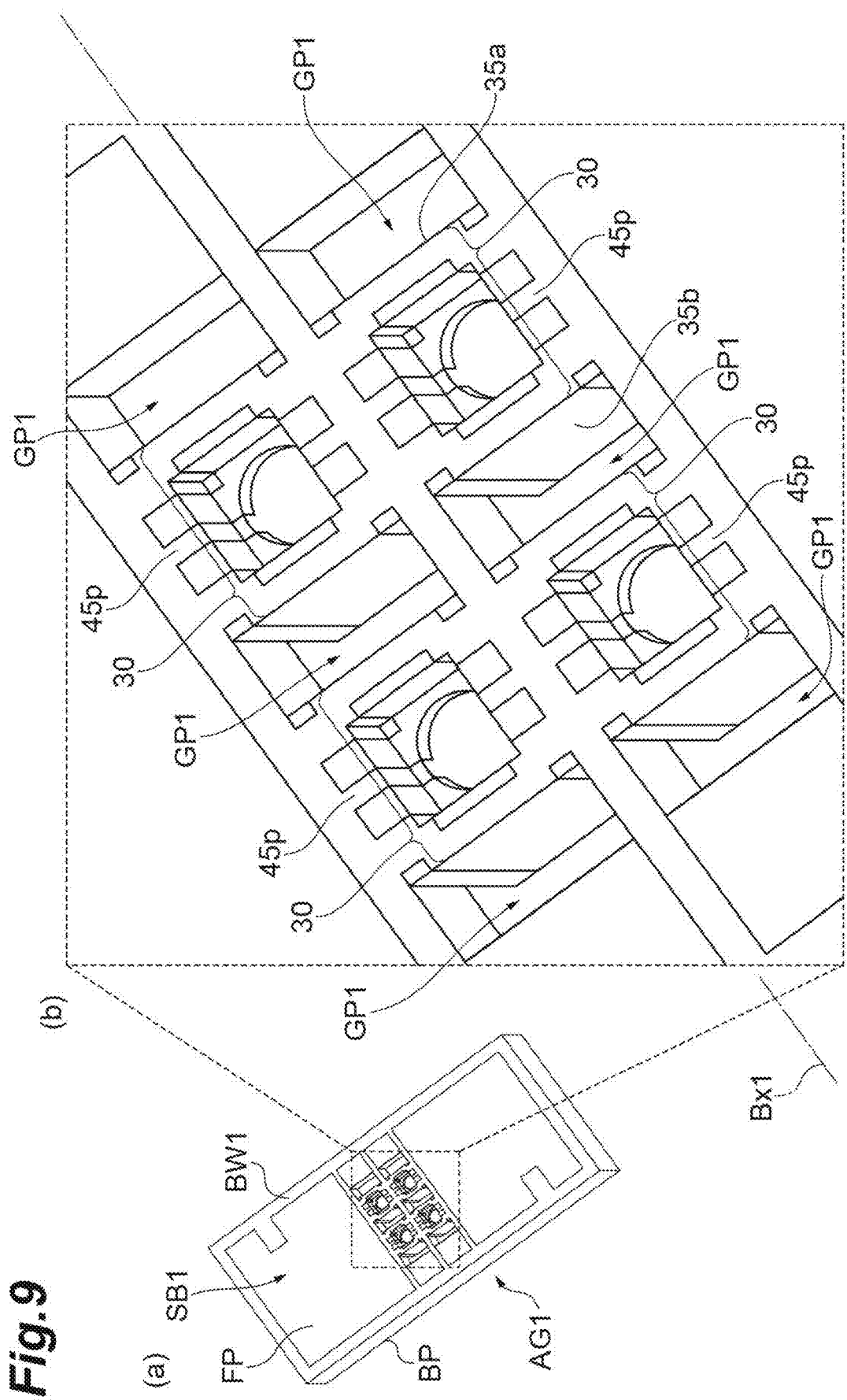
FIG. 9 is a view schematically illustrating the main process in the method for making the light-emitting device according to the first embodiment.
Figure 10:
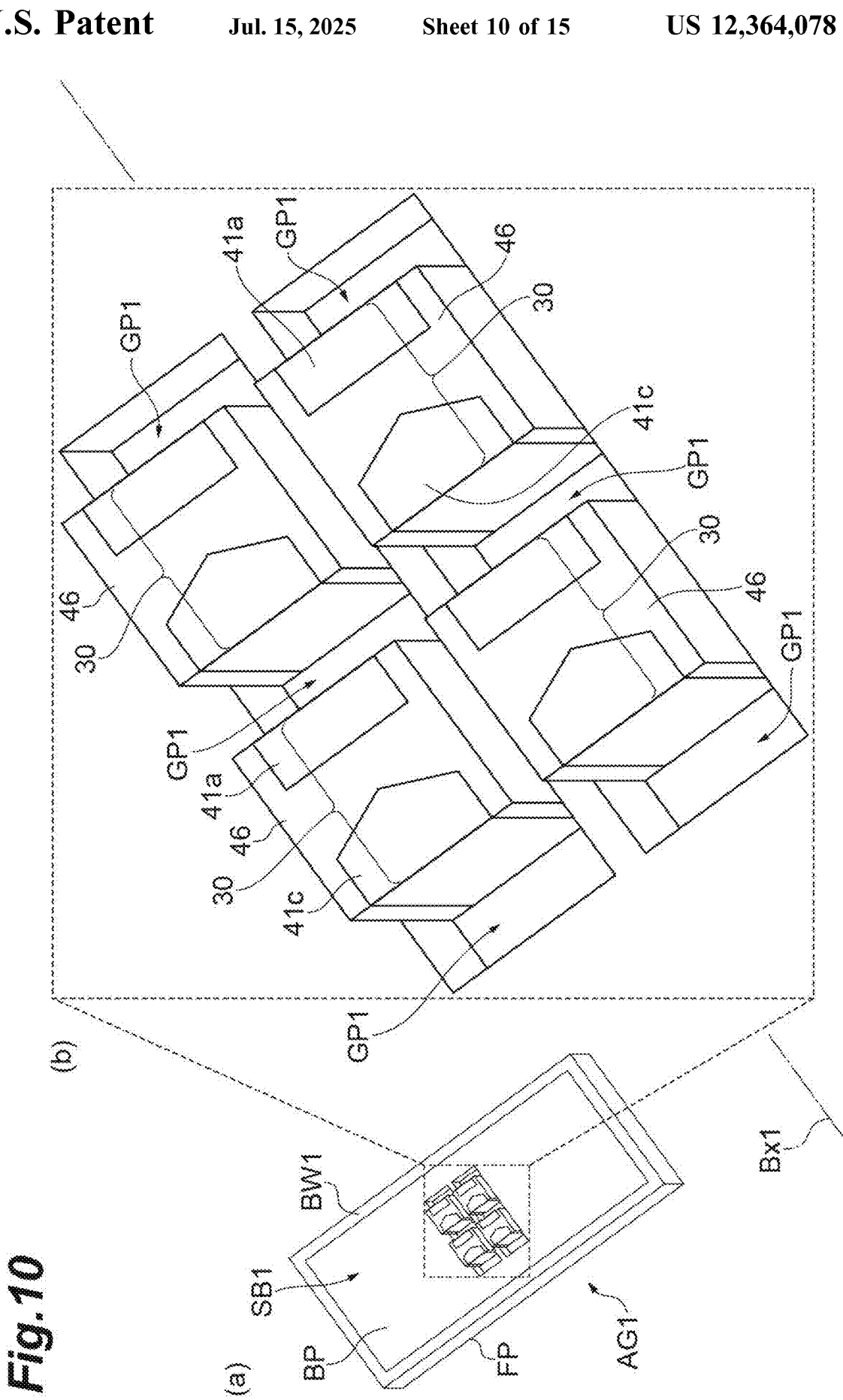
FIG. 10 is a view schematically illustrating the main process in the method for making the light-emitting device according to the first embodiment.
Figure 11:
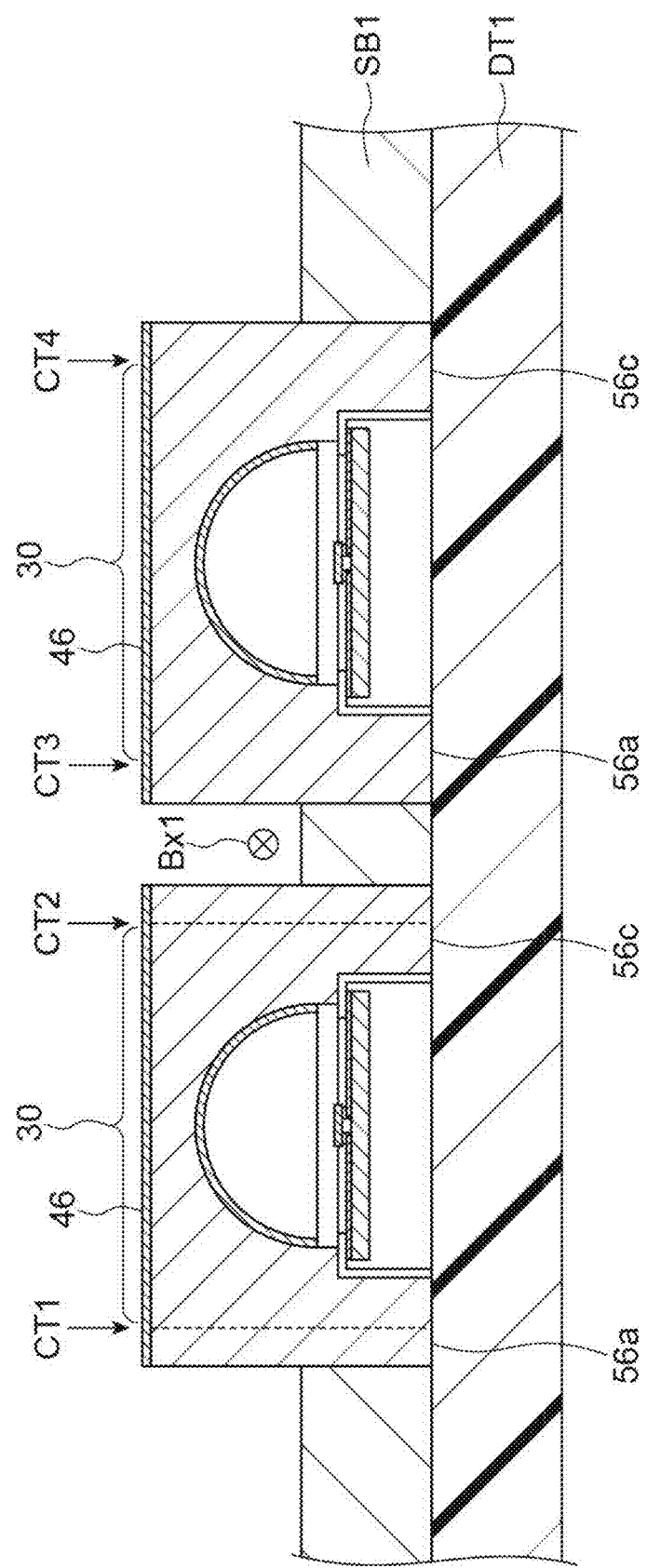
FIG. 11 is a view schematically illustrating the main process in the method for making the light-emitting device according to the first embodiment.

Hereinafter, a method for making the light-emitting device D1 will be described with reference to FIGS. 7 to 11. FIG. 7 is a flowchart illustrating a method for making the light-emitting device according to the first embodiment. FIGS. 8, 9, 10, and 11 are views schematically illustrating a main process in the method for making the light-emitting device according to the first embodiment. FIG. 8(a) is a schematic view illustrating a cross-sectional configuration of a window base used in the method for making the light-emitting device according to the first embodiment. FIG. 8(b) is a view illustrating an electric conductor pattern on the window in the method for making the light-emitting device according to the first embodiment, and FIG. 8(c) is a view illustrating a light source mounted on the electric conductor pattern in FIG. 8(b). FIG. 9(a) is a view illustrating a block in which a plurality of packages are connected in an array from an upper wall surface side of the package, and FIG. 9(b) is an enlarged view illustrating the packages of FIG. 9(a). FIG. 10(a) is a view illustrating the block from a bottom surface side of the package, and FIG. 10(b) is an enlarged view illustrating the packages of FIG. 10(a). FIG. 11 is a diagram illustrating separation of the block.

(Preparation of Window)

In process S1, the window 20 is prepared. First, in process S1a, a transparent substrate for forming the window base 21 is prepared. The window base 21 of the transparent substrate is, for example, a silicon substrate. If necessary, an antireflection film AR is formed on the lower surface 23 of the window base 21. In this case, the window 20 includes the antireflection film AR disposed on the lower surface 23. The antireflection film AR effectively reduces light reflection of infrared light having wavelengths of 3 to 5 μm generated in a transparent substrate, for example. The antireflection film AR may be formed on the light exit surface 22 of the window base 21. In this case, the window 20 includes the antireflection film AR disposed on the light exit surface 22. The antireflection film AR may be formed on the lower surface 23 and the light exit surface 22. In this case, the window 20 includes the antireflection film AR disposed on the lower surface 23 and the antireflection film AR disposed on the light exit surface 22. The configuration in which the antireflection film AR is disposed on the lower surface 23 and the light exit surface 22 more effectively reduces light reflection of infrared light having wavelengths of 3 to 5 μm generated in a transparent substrate, for example.

Next, in process S1b, first, a plurality of first pads 25 and a plurality of electrically conductive lines 27 of the electrically conductive body WD1 are formed on the lower surface 23 of the window base 21. In forming the electrically conductive body WD1, for example, Cu plating, Ni plating, and Au plating are performed in this order to form a electric conductor pattern of Cu—Ni—Au metal plating. The Au layer is positioned on the uppermost layer of the metal plating of the electric conductor pattern. The electric conductor pattern is formed, for example, such that one section of electrically conductive bodies WD1 are arranged one-dimensionally or two-dimensionally. The first pad 25 includes, for example, the first pad body 63 and the second pad body 64, and the electrically conductive line 27 includes the first electrically conductive line 81 and the second electrically conductive line 82.

Next, in process S1b, a plurality of third pads 26 and dummy pads 28 in the electrically conductive body WD1 are formed to mount the light source 10 on the lower surface 23 of the window base 21. The third pad 26 includes, for example, the first mounting pad body 61 and the second mounting pad body 62. The dummy pad 28 includes, for example, the first dummy pad body 71 and the second dummy pad body 72. In forming the electrically conductive body WD1, for example, a cream solder is applied on the electric conductor pattern. A cream solder 26a for forming the third pad 26 includes, for example, a solder 61a for forming the first mounting pad body 61 and a solder 62a for forming the second mounting pad body 62. A cream solder 28a for forming the dummy pads 28 includes a solder 71a for forming the first dummy pad body 71 and a solder 72a for forming the second dummy pad body 72. The solder 61a and the solder 62a are applied to be positioned on the end edge of the electrically conductive line 27. For example, the end edge of the first electrically conductive line 81 is positioned between the window base 21 and the solder 61a along the direction Ax1. The cream solder includes, for example, Sn, a metal having a melting point higher than the melting point of Sn, and a flux.

In process S1c, the light source 10 is mounted on the applied cream solder. In this mounting, heat treatment (reflow) is performed to melt the printed cream solder, whereby the light source 10 is mounted on the cream solder. The light source 10 is mounted such that the anode terminal 14 and the cathode terminal 16 of the light source 10 are electrically connected to, for example, the first mounting pad body 61 and the second mounting pad body 62, respectively. The cream solder is cooled after the light source 10 is mounted. From this cooling, the cream solder is solidified, and the light source 10 is fixed on the pad. The light source 10 is also fixed with the first dummy pad body 71 and the second dummy pad body 72 together with the first mounting pad body 61 and the second mounting pad body 62.

In process S1c, next, the underfill UF is injected into a gap generated between the lower surface 23, the third pad 26, the dummy pad 28, and the light source 10 to form a substrate product SP1. The substrate product SP1 includes a plurality of one-section electrically conductive bodies WD1 arranged one-dimensionally or two-dimensionally. The underfill UF includes, for example, an epoxy resin.

In process S1d, the substrate product SP1 is separated to form a plurality of windows 20 separated for each section. The separation of the substrate product SP1 is performed, for example, using a blade dicing method, and the substrate product SP1 is cut along cutting lines C1 to C4 such that the substrate product SP1 is separated by one section. Electric conductor pattern may or may not be formed on the cutting lines C1 to C4. When electric conductor patterns are not formed on the cutting lines C1 to C4, an interval between the electric conductor patterns adjacent to each other with the cutting lines C1 to C4 interposed therebetween may be, for example, wider than the width of the blade used in the blade dicing method. Each of the windows 20 of one section separated by cutting is two-dimensionally arranged on a chip tray, for example. After process S1b, the window 20 is prepared.

(Preparation of Block)

In process S2, a block AG1 is prepared. First, in process S2a, a preparation body of the block AG1 is formed such that a plurality of packages 30 are connected in an array. In the preparation body, a plurality of package preparation bodies prepared to form the package 30 before the reflection portion and the electric conductor are coupled in an array, and are made using, for example, an injection molding method. The preparation body includes a plurality of package preparation bodies and a substrate portion SB1 supporting the package preparation bodies. The substrate portion SB1 is installed to surround the plurality of package preparation bodies. The preparation body includes a plurality of package preparation bodies arranged one-dimensionally or two-dimensionally in the substrate portion SB1.

In the present embodiment, the preparation body includes, for example, four package preparation bodies, and these package preparation bodies are arranged in two rows and two columns. The package preparation body has the same outer shape as the package 30 except for the reflection portion and the electric conductor disposed on the surface of the package 30. The material contained in the package preparation body may be the same as the material of the substrate portion SB1, and is, for example, a ceramic or a polyphthalamide (PPA) resin.

In the preparation body, the upper wall surface 56 of the package preparation body may be substantially flush with a front surface FP of the substrate portion SB1. A distance from a back surface BP of the substrate portion SB1 to the bottom surface 46 of the package preparation body is larger than, for example, a distance from the front surface FP of the substrate portion SB1 to the back surface BP, that is, the thickness of the substrate portion SB1. In process S2a, plasma treatment is performed on the surface of the preparation body for activating the surface as necessary.

Next, in process S2b, metallizing for forming a metal thin film containing Cu, for example, is performed on the surface of the preparation body subjected to process S2a. After preparation of the thin film, patterning for forming the reflection portion 32 and the electric conductor 34 is performed using, for example, a laser patterning method. Due to patterning, in process S2b, for example, metal plating is formed by using an electrically conductive base BW1 disposed on the surface of the preparation body. The electrically conductive base BW1 is disposed to surround the four package preparation bodies, and is electrically connected to the four package preparation bodies. The electrically conductive base BW1 conducts electricity necessary for forming metal plating for the four package preparation bodies. Due to conducting electricity from the electrically conductive base BW1, electric Cu plating is formed in a region where the electric conductor 34 is disposed. The electrically conductive base BW1 includes an electrically conductive body of the reflection portion 45p for forming the first reflection portion electric conductor 45a and the second reflection portion electric conductor 45b. The reflection portion 32 is formed due to conducting electricity from the electrically conductive body of the reflection portion 45p.

For example, Ni plating and subsequent Au plating are further formed on the disposed Cu plating. The reflection portion 32 and the electric conductor 34 including Cu—Ni—Au metal plating are formed. In the present embodiment, the Au layer is positioned on the uppermost layer of the metal plating. The block AG1 including the package 30 is prepared after forming the metal plating.

In the block AG1, in each package 30, the first outer electric conductor 35a is formed on the first outer wall surface 54a, and the third outer electric conductor 35c is formed on the third outer wall surface 54c. In the block AG1, a gap GP1 exists between one package 30 and another package 30 arranged along a direction Bx1 from the first outer wall surface 54a to the third outer wall surface 54c. The package 30 and the gap GP1 are alternately arranged. The gap GP1 is, for example, a work region for forming the first outer electric conductor 35a and the third outer electric conductor 35c on the first outer wall surface 54a and the third outer wall surface 54c, respectively.

(Mounting of Window)

In process S3, the window 20 is mounted on each package 30 of the block AG1. In process S3, the window 20 is mounted on the placement surface 44 such that the first pad 25 of the window 20 is electrically connected to the second pad 36 of the placement surface 44. The window 20 is mounted on the placement surface 44 through, for example, an electrically conductive resin. The window 20 is fixed to the package 30 through the adhesiveness of the electrically conductive resin.

(Separation of Block)

In process S4, the block AG1 is separated to obtain a plurality of packages 30 on which the corresponding windows 20 are mounted. The separation of the block AG1 is performed due to, for example, blade dicing. In the present embodiment, when the block AG1 is separated, the block AG1 is diced along cutting planned lines CT1 to CT4 set between the packages 30 adjacent to each other after the upper wall surface 56 is attached to a dicing tape DT1.

The cutting planned lines CT1 to CT4 are positioned in the direction Bx1 from the first outer wall surface 54a to the third outer wall surface 54c. From cutting due to dicing, the second outer wall surface 54b and the fourth outer wall surface 54d are separated from the block AG1. After this separation, the plurality of packages 30 on which the corresponding windows 20 are mounted are cut for each section, and the making of the light-emitting device D1 is completed.

In a method MT1 for making the light-emitting device, the wall portion 50 of the package 30 is disposed along the window base 21. Thus, when the window 20 is mounted in each package 30 of the block AG1, the window 20 is mounted with the wall portion 50 (among these, in particular, the inner wall surface 52) of the package 30 as a mark. Since the mark exists, the window 20 is easily mounted on each package 30 of the block AG1 such that the first pad 25 and the second pad 36 corresponding to each other are electrically connected.

In the method M1 for making the light-emitting device, the height from the placement surface 44 to the upper wall surface 56 is larger than the height from the placement surface 44 to the light exit surface 22 in a state where the window 20 is mounted to correspond to each package 30 of the block AG1.

According to the method M1 for making the light-emitting device, the height from the placement surface 44 to the upper wall surface 56 is larger than the height from the placement surface 44 to the light exit surface 22. Thus, only the upper wall surface 56 is attached to the dicing tape when the block AG1 is separated due to dicing. The lower surface 23 of the window base 21 does not come into contact with the dicing tape DT1, and the window base 21 is prevented from being deteriorated due to adhesion of the adhesive. When the block AG1 is separated due to dicing, water may be poured on the block AG1 for washing away dicing powder generated due to dicing and cooling, for example. However, the height from the placement surface 44 to the upper wall surface 56 may be larger than the height from the placement surface 44 to the light exit surface 22. Thus, entry of water into the window base 21 is effectively suppressed through the wall portion 50 disposed along the window base 21. An occurrence of an electrical short circuit due to adhesion of water, an increase in light absorption due to water, or deterioration of the window base 21 due to adhesion of water is reduced.

Second Embodiment

Figure 12:
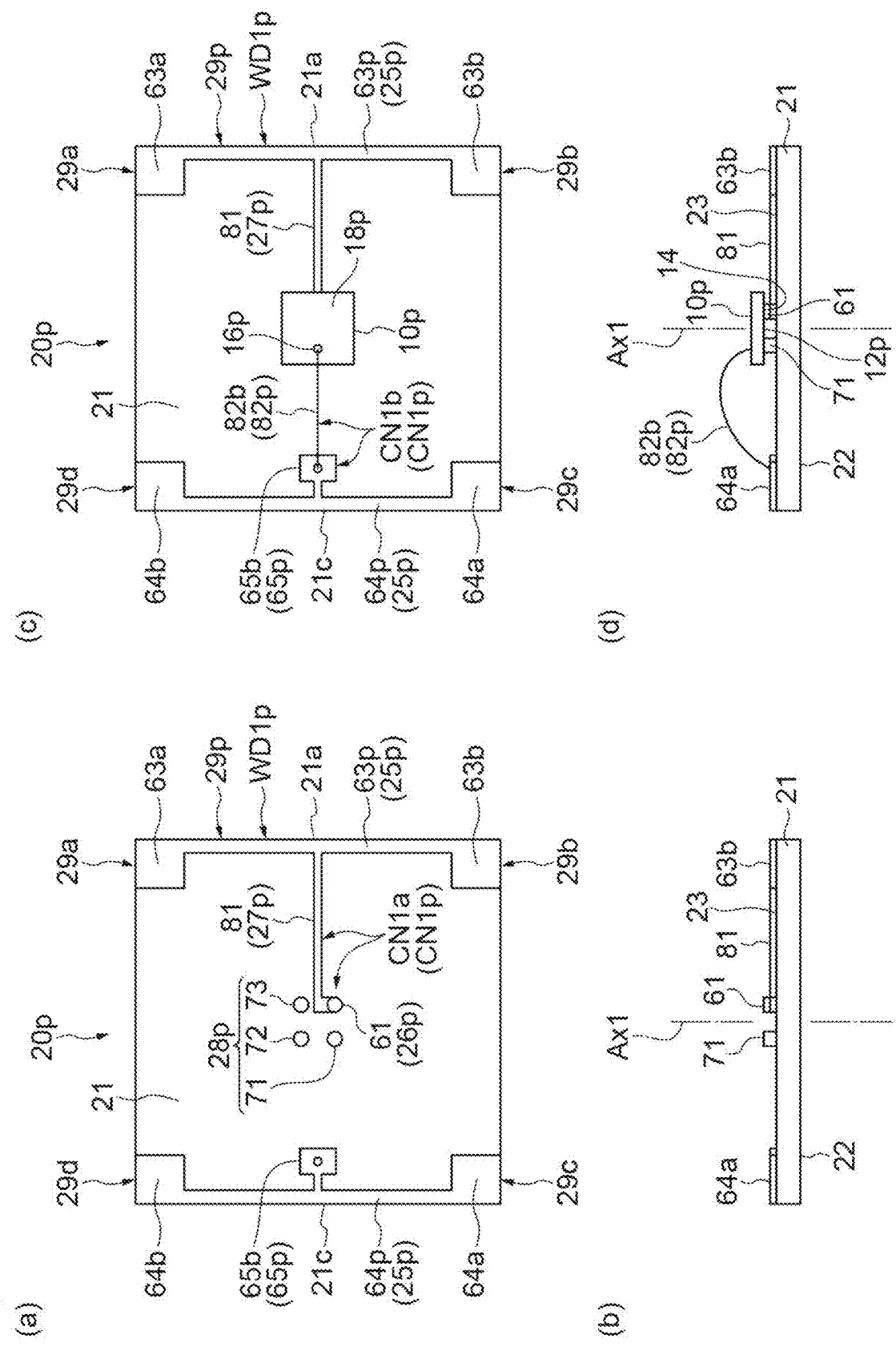
FIG. 12(a) is a plan view of a window according to a second embodiment.
FIG. 12(b) is a front view of the window according to the second embodiment.
FIG. 12(c) is a plan view of the window on which a light source according to the second embodiment is mounted.
FIG. 12(d) is a front view of the window on which the light source according to the second embodiment is mounted.

Next, a configuration of a light-emitting device according to a second embodiment will be described. FIG. 12(a) is a plan view of a window according to the second embodiment, and FIG. 12(b) is a front view of the window according to the second embodiment. FIG. 12(c) is a plan view of the window on which a light source according to the second embodiment is mounted, and FIG. 12(d) is a front view of the window on which the light source according to the second embodiment is mounted. The light-emitting device according to the second embodiment has the same configuration as the light-emitting device D1 according to the first embodiment except for the window 20.

A window 20p according to the second embodiment will be described below with reference to FIGS. 12(a) to 12(d). The window 20p includes the window base 21 and an electrically conductive body WD1p. The window base 21 includes the light exit surface 22 and the lower surface 23 opposing the light exit surface 22. The electrically conductive body WD1p is disposed on the lower surface 23 of the window base 21.

A light source 10p of the present embodiment includes, for example, a light-emitting diode and has a surface mounting type rectangular parallelepiped shape. One surface of the light source 10p is a terminal surface 12p. One of the anode terminal 14 and a cathode terminal 16p, for example, the anode terminal 14 is disposed on the terminal surface 12p. The light source 10p includes a radiation surface 18p on the opposite side of the terminal surface 12p. In the present embodiment, for example, the other of the anode terminal 14 and the cathode terminal 16p, for example, the cathode terminal 16p is disposed on the radiation surface 18p.

The electrically conductive body WD1p on the window base 21 includes a plurality of first pads 25p. The plurality of first pads 25p oppose the placement surface 44 and are disposed in a peripheral region surrounding the central region in the window 20p. In the present embodiment, the plurality of first pads 25p include, for example, a first pad body 63p and a second pad body 64p. For example, the first pad body 63p is disposed from the first corner portion 29a to the second corner portion 29b on the first side portion 21a. The second pad body 64p is disposed from the third corner portion 29c to the fourth corner portion 29d on the third side portion 21c.

For example, the first pad body 63p includes the first connection portion 63a at one end edge of the first pad body 63p, and the second connection portion 63b at another end edge of the first pad body 63p. The first connection portion 63a is disposed at the first corner portion 29a. The second connection portion 63b is disposed at the second corner portion 29b. The first connection portion 63a and the second connection portion 63b electrically connect the first pad body 63p and the electric conductor 34 disposed in the package 30.

For example, the second pad body 64p includes the third connection portion 64a at one end edge of the second pad body 64p, and the fourth connection portion 64b at another end edge of the second pad body 64p. The third connection portion 64a is disposed at the third corner portion 29c. The fourth connection portion 64b is disposed at the fourth corner portion 29d. The third connection portion 64a and the fourth connection portion 64b connect the second pad body 64p and the electric conductor 34 disposed in the package 30.

The electrically conductive body WD1p on the window base 21 further includes a plurality of connectors CN1p. One connector CN1a of the plurality of connectors CN1p includes a third pad 26p. The light source 10p is mounted on the third pad 26p. The third pad 26p is disposed on a region where the light source 10p is mounted on the window base 21, for example, a central region of the window base 21. In the present embodiment, the third pad 26p includes, for example, the first mounting pad body 61. For example, the first mounting pad body 61 is electrically connected to the anode terminal 14 positioned on the terminal surface 12p of the light source 10p.

The window 20p includes a dummy pad 28p disposed on the lower surface 23. The light source 10p is mounted on the dummy pad 28p. The dummy pad 28p includes, for example, the first dummy pad body 71, the second dummy pad body 72, and a third dummy pad body 73. The first dummy pad body 71, the second dummy pad body 72, and the third dummy pad body 73 support the light source 10p together with the first mounting pad body 61. The first dummy pad body 71, the second dummy pad body 72, and the third dummy pad body 73 support the light source 10p, but are not electrically connected to the light source 10p.

For example, the first mounting pad body 61, the first dummy pad body 71, the second dummy pad body 72, and the third dummy pad body 73 may be positioned in this order at respective vertexes of a quadrangle virtually drawn in a region of the lower surface 23 where the light source 10p is mounted. If necessary, the window 20p includes the underfill UF. The underfill UF is disposed to fill a gap generated between the lower surface 23, the third pad 26p, the dummy pad 28p, and the light source 10p.

In the present embodiment, for example, the light source 10p is supported with the four pads, that is, the first mounting pad body 61, the first dummy pad body 71, the second dummy pad body 72, and the third dummy pad body 73. Thus, the light source 10p is stably mounted on the window 20p. The heat generated from the light source 10p is efficiently conducted to the electrically conductive body WD1p particularly through the first mounting pad body 61.

One connector CN1a of the plurality of connectors CN1p further includes an electrically conductive line 2'7p. The electrically conductive line 27p electrically connects the first pad 25p and the third pad 26p corresponding to each other. For example, the electrically conductive line 27p electrically connects the first pad body 63p of the first pad 25p and the first mounting pad body 61 of the third pad 26p.

The electrically conductive line 2'7p includes, for example, the first electrically conductive line 81. The first electrically conductive line 81 electrically connects the first pad body 63p and the first mounting pad body 61. For example, one end edge of the first electrically conductive line 81 is connected to the first pad body 63p to cross the first pad body 63p. For example, another end edge of the first electrically conductive line 81 is connected to the first mounting pad body 61. One end edge of the first electrically conductive line 81 and the first pad body 63p intersect, for example, near the center of the first pad body 63p. The other end edge of the first electrically conductive line 81 is positioned, for example, between the window base 21 and the first mounting pad body 61 in the direction Ax1.

Among the plurality of connectors CN1p, a connector CN1b different from the one connector CN1a includes a fourth pad 65p and a line 82p. The fourth pad 65p includes, for example, a second connection pad 65b. The second connection pad 65b is electrically connected to the first pad 25p (first pad body 63p) in the middle of the third connection portion 64a and the fourth connection portion 64b. The line 82p electrically connects the fourth pad 65p (second connection pad 65b) and the light source 10p. The first pad 25p and the light source 10p are electrically connected through the fourth pad 65p and the line 82p. For example, one end edge of the line 82p is connected to the fourth pad 65p (second connection pad 65b). For example, the other end edge of the line 82p is connected to the cathode terminal 16p of the light source 10p. For example, the line 82p electrically connects the cathode terminal 16p positioned on the radiation surface 18p of the light source 10p and the fourth pad 65p (second connection pad 65b). The line 82p is, for example, a second bonding line 82b.

In the light-emitting device according to the present embodiment, the light source 10p is mounted on the third pad 26p of one connector CN1a, and the first pad 25p and the third pad 26p are electrically connected through the electrically conductive line 2'7p of one connector CN1a. The light source 10p is mounted on the third pad 26p, and is electrically connected to the first pad 25p. The light source 10p and the fourth pad 65p are electrically connected through the wire 82p of another connector CN1b. The fourth pad 65p is electrically connected to the first pad 25p. The light source 10p is electrically connected to the first pad 25p through the wire 82p.

Third Embodiment

Figure 13:
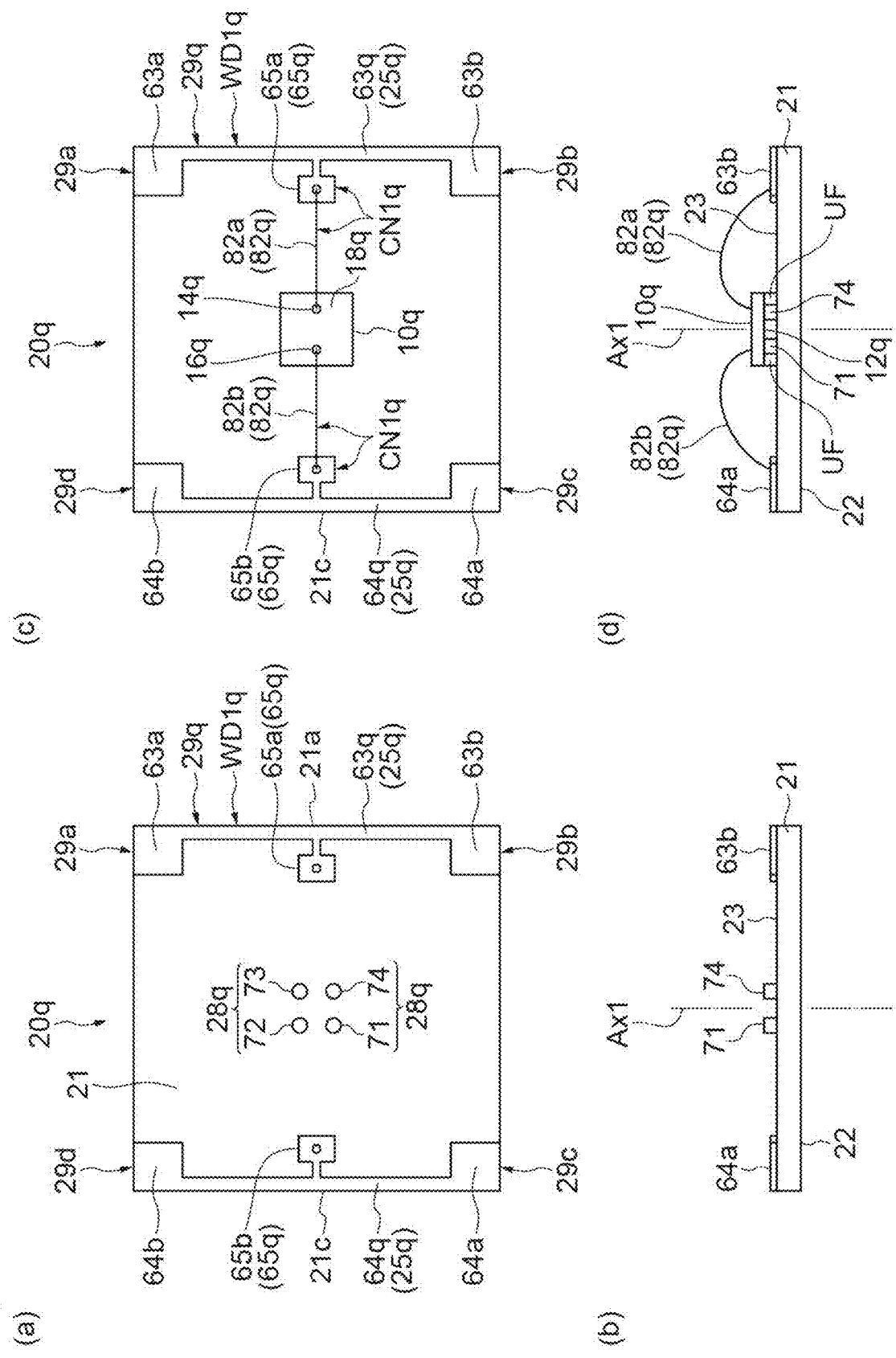
FIG. 13(a) is a plan view of a window according to a third embodiment.
FIG. 13(b) is a front view of the window according to the third embodiment.
FIG. 13(c) is a plan view of the window on which a light source according to the third embodiment is mounted.
FIG. 13(d) is a front view of the window on which the light source according to the third embodiment is mounted.

Next, a configuration of a light-emitting device according to a third embodiment will be described. FIG. 13(a) is a plan view of a window according to the third embodiment, and FIG. 13(b) is a front view of the window according to the third embodiment. FIG. 13(c) is a plan view of the window on which a light source according to the third embodiment is mounted, and FIG. 13(d) is a front view of the window on which the light source according to the third embodiment is mounted. The light-emitting device according to the third embodiment has the same configuration as the light-emitting device D1 according to the first embodiment except for the window 20.

Hereinafter, a window 20q according to the third embodiment will be described with reference to FIGS. 13(a) to 13(d). The window 20q includes the window base 21 and an electrically conductive body WD1q. The window base 21 includes the light exit surface 22 and the lower surface 23 opposing the light exit surface 22. The electrically conductive body WD1q is disposed on the lower surface 23 of the window base 21.

A light source 10q of the present embodiment includes, for example, a light-emitting diode and has a surface mounting type rectangular parallelepiped shape. One surface of the light source 10q is a terminal surface 12q. The light source 10q includes a radiation surface 18q on the opposite side of the terminal surface 12q, and light is emitted from the radiation surface 18q to the reflection portion 32. In the present embodiment, for example, an anode terminal 14q and a cathode terminal 16q are disposed on the radiation surface 18q.

The electrically conductive body WD1p on the window base 21 includes a plurality of first pads 25q. The plurality of first pads 25q oppose the placement surface 44 and are disposed in a peripheral region surrounding the central region in the window 20q. In the present embodiment, the plurality of first pads 25q include for example, a first pad body 63q and a second pad body 64q. For example, the first pad body 63q is disposed from the first corner portion 29a to the second corner portion 29b on the first side portion 21a. The second pad body 64q is disposed from the third corner portion 29c to the fourth corner portion 29d on the third side portion 21c.

For example, the first pad body 63q includes the first connection portion 63a at one end edge of the first pad body 63q, and the second connection portion 63b at the other end edge of the first pad body 63q. The first connection portion 63a is disposed at the first corner portion 29a. The second connection portion 63b is disposed at the second corner portion 29*b*. The first connection portion 63*a* and the second connection portion 63*b* electrically connect the first pad body 63*q* and the electric conductor 34 disposed in the package 30.

The second pad body 64*q* includes, for example, the third connection portion 64*a* and the fourth connection portion 64*b*. The third connection portion 64*a* is positioned at one end edge of the second pad body 64*q*. The fourth connection portion 64*b* is positioned at another end edge of the second pad body 64*q*. The third connection portion 64*a* is disposed at the third corner portion 29*c*. The fourth connection portion 64*b* is disposed at the fourth corner portion 29*d*. The third connection portion 64*a* and the fourth connection portion 64*b* connect the second pad body 64*q* and the electric conductor 34 disposed in the package 30.

The window 20*q* includes a dummy pad 28*q* disposed on the lower surface 23. The light source 10*q* is mounted on the dummy pad 28*q*. The dummy pad 28*q* includes, for example, the first dummy pad body 71, the second dummy pad body 72, the third dummy pad body 73, and a fourth dummy pad body 74. The first dummy pad body 71, the second dummy pad body 72, the third dummy pad body 73, and the fourth dummy pad body 74 support the light source 10*q*. The first dummy pad body 71, the second dummy pad body 72, the third dummy pad body 73, and the fourth dummy pad body 74 support the light source 10*q* but are not electrically connected to the light source 10*q*.

The first dummy pad body 71, the second dummy pad body 72, the third dummy pad body 73, and the fourth dummy pad body 74 are positioned, for example, in this order at respective vertexes of a quadrangle virtually drawn in a region of the lower surface 23 where the light source 10*q* is mounted. If necessary, the window 20*q* includes the underfill UF. The underfill UF is disposed to fill a gap generated between the lower surface 23, the dummy pad 28*q*, and the light source 10*q*.

In the present embodiment, for example, the light source 10*q* is supported with four dummy pads, that is, the first dummy pad body 71, the second dummy pad body 72, the third dummy pad body 73, and the fourth dummy pad body 74. Therefore, the light source 10*q* is stably mounted on the window 20*q*.

The electrically conductive body WD1*q* on the window base 21 further includes a plurality of connectors CN1*q*, and each of the connectors CN1*q* includes a fourth pad 65*q* and a wire 82*q*. The fourth pad 65*q* includes, for example, a first connection pad 65*a* and a second connection pad 65*b*. The wire 82*q* includes, for example, the first bonding wire 82*a* and the second bonding wire 82*b*.

The first connection pad 65*a* is electrically connected to the first pad 25*q* (first pad body 63*q*) in the middle between the first connection portion 63*a* and the second connection portion 63*b*. The second connection pad 65*b* is electrically connected to the first pad 25*q* (second pad body 64*q*) in the middle between the third connection portion 64*a* and the fourth connection portion 64*b*. The wire 82*q* electrically connects the fourth pad 65*q* and the light source 10*q*. The first pad 25*q* and the light source 10*q* are electrically connected through the fourth pad 65*q* and the wire 82*q*. For example, one end edge of the first bonding wire 82*a* is connected to the fourth pad 65*q* (first connection pad 65*a*). For example, another end edge of the first bonding wire 82*a* is connected to the anode terminal 14*q* of the light source 10*q*. For example, the second bonding wire 82*b* electrically connects the cathode terminal 16*q* positioned on the radiation surface 18*q* of the light source 10*q* and the fourth pad 65*q* (second connection pad 65*b*).

In the light-emitting device according to the present embodiment, the light source 10*q* and the fourth pad 65*q* are electrically connected through the wire 82*q* of each connector CN1*q*. The fourth pad 65*q* is electrically connected to the first pad 25*q*. The light source 10*q* is electrically connected to the first pad 25*q* through the wire 82*q*.

Fourth Embodiment

Next, a configuration of a light-emitting device D2 according to a fourth embodiment will be described. FIG. 14(*a*) is a plan view of a light-emitting device according to the fourth embodiment, and FIG. 14(*b*) is a side view of the light-emitting device according to the fourth embodiment. FIG. 14(*c*) is a front view of the light-emitting device according to the fourth embodiment, and FIG. 14(*d*) is a bottom view of the light-emitting device according to the fourth embodiment. The light-emitting device D2 according to the fourth embodiment has the same configuration as the light-emitting device D1 according to the first embodiment except for an electric conductor 34*m*.

As illustrated in FIGS. 14(*a*) to 14(*d*), a package 30*m* according to the fourth embodiment includes the electric conductor 34*m*. The electric conductor 34*m* is disposed on the placement surface 44, the inner wall surface 52, and the upper wall surface 56. In the present embodiment, unlike the first embodiment, the electric conductor 34*m* is disposed on the placement surface 44, the inner wall surface 52, and the upper wall surface 56, but is not disposed on the outer wall surface 54 and the outer side surface 48.

The electric conductor 34*m* includes, for example, a first upper electric conductor 39*e* and a third upper electric conductor 39*f* on the upper wall surface 56. The first upper electric conductor 39*e* is disposed on the first upper wall surface 56*a*, the second upper wall surface 56*b*, and the fourth upper wall surface 56*d* except for the first corner portion 31*a* and the second corner portion 31*b*. The third upper electric conductor 39*f* is disposed on the second upper wall surface 56*b*, the third upper wall surface 56*c*, and the fourth upper wall surface 56*d* except for the third corner portion 31*c* and the fourth corner portion 31*d*. The electric conductor 34*m* is not disposed on the corner portion 31.

The first upper electric conductor 39*e* may be disposed in a region of 50% or more of the area of the first upper wall surface 56*a* on the first upper wall surface 56*a*. The third upper electric conductor 39*f* may be disposed in a region of 50% or more of the area of the third upper wall surface 56*c* on the third upper wall surface 56*c*. That is, the electric conductor 34*m* may be disposed on the upper wall surface 56 such that the ratio of the area of the electric conductor 34*m* to the area of the upper wall surface 56 is 50% or more. On the upper wall surface 56, a configuration in which the ratio of the area of the electric conductor 34*m* to the area of the upper wall surface 56 is 50% or more enhances the heat dissipation through the electric conductor 34*m*.

Fifth Embodiment

Next, a configuration of a light-emitting device D3 according to a fifth embodiment will be described. FIG. 15(*a*) is a plan view of a light-emitting device according to the fifth embodiment, and FIG. 15(*b*) is a side view of the light-emitting device according to the fifth embodiment. FIG. 15(*c*) is a front view of the light-emitting device according to the fifth embodiment, and FIG. 15(*d*) is a bottom view of the light-emitting device according to the fifth embodiment. The light-emitting device D3 according to the fifth embodiment has the same configuration as the light-emitting device D1 according to the first embodiment except for an electric conductor 34n.

As illustrated in FIGS. 15(a) to 15(d), a package 30n according to the fifth embodiment includes the electric conductor 34n, and the electric conductor 34n is disposed on the placement surface 44, the inner wall surface 52, the upper wall surface 56, and the outer wall surface 54. In the present embodiment, unlike the first embodiment, the electric conductor 34n is disposed on the placement surface 44, the inner wall surface 52, the upper wall surface 56, and the outer wall surface 54, but is not disposed on the outer side surface 48.

The electric conductor 34n includes, for example, a first upper electric conductor 39g and a third upper electric conductor 39h on the upper wall surface 56. The first upper electric conductor 39g is disposed on the first upper wall surface 56a, the second upper wall surface 56b, and the fourth upper wall surface 56d except for the first corner portion 31a and the second corner portion 31b. The third upper electric conductor 39h is disposed on the second upper wall surface 56b, the third upper wall surface 56c, and the fourth upper wall surface 56d except for the third corner portion 31c and the fourth corner portion 31d. The electric conductor 34n is not disposed on the corner portion 31.

The first upper electric conductor 39g may be disposed in a region of 50% or more of the area of the first upper wall surface 56a on the first upper wall surface 56a. The third upper electric conductor 39h may be disposed in a region of 50% or more of the area of the third upper wall surface 56c on the third upper wall surface 56c. That is, the electric conductor 34n may be disposed on the upper wall surface 56 such that the ratio of the area of the electric conductor 34n to the area of the upper wall surface 56 is 50% or more. On the upper wall surface 56, a configuration in which the ratio of the area of the electric conductor 34n to the area of the upper wall surface 56 is 50% or more enhances the heat dissipation through the electric conductor 34n.

The package 30 includes a first outer electric conductor 35g disposed on the first outer wall surface 54a. The package 30 includes a third outer electric conductor 35h on the third outer wall surface 54c. The first outer electric conductor 35g is electrically connected to the first upper electric conductor 39g. The third outer electric conductor 35h is electrically connected to the third upper electric conductor 39h. The first outer electric conductor 35g is not disposed on the first ridge portion 33a and the second ridge portion 33b. The third outer electric conductor 35h is not disposed on the third ridge portion 33c and the fourth ridge portion 33d. The electric conductor 34n is not disposed on the ridge portion 33.

The first outer electric conductor 35g may be disposed in a region of 50% or more of the area of the first outer wall surface 54a on the first outer wall surface 54a. The third outer electric conductor 35h may be disposed in a region of 50% or more of the area of the third outer wall surface 54c on the third outer wall surface 54c. That is, the electric conductor 34n may be disposed on the outer wall surface 54 such that the ratio of the area of the electric conductor 34n to the area of the outer wall surface 54 is 50% or more. A configuration in which the ratio of the area of the electric conductor 34n to the area of the outer wall surface 54 is 50% or more enhances the heat dissipation through the electric conductor 34n on the outer wall surface 54.

Although the embodiments of the present invention have been described above, the present invention is not necessarily limited to the above-described embodiments, and various modifications can be made without departing from the gist thereof.

This specification discloses the following supplementary notes.

(Supplementary Note 1)

A light-emitting device including:

a light source;

a window mounting the light source; and a package defining a space with the window, the light source being disposed in the space, wherein the window includes a window base including a light exit surface, a lower surface, opposing the light exit surface, and a side surface coupling the light exit surface and the lower surface, and an electrically conductive body disposed on the lower surface of the window base, the package includes a base portion formed with a recess open toward the lower surface, the base portion including a placement surface disposed along an edge of the recess and opposing the lower surface, a bottom surface opposing the placement surface, and an outer side surface coupled to the bottom surface, a wall portion including an inner wall surface coupled to the placement surface and opposing the side surface, an outer wall surface opposing the inner wall surface and coupled to the outer side surface, and an upper wall surface coupling the inner wall surface and the outer wall surface, the wall portion disposed along the window base when viewed from a direction orthogonal to the light exit surface, a reflection portion disposed on a surface of the recess, being configured to reflect light emitted from the light source to the window, and an electric conductor disposed on the placement surface, the inner wall surface, and the upper wall surface, the window base is configured to transmit the light reflected on the reflection portion, the electrically conductive body includes a plurality of first pads opposing the placement surface, and a plurality of connectors electrically connecting the light source and the plurality of first pads, and the electric conductor includes a plurality of second pads disposed on the placement surface to oppose corresponding first pads of the plurality of first pads and electrically connected to the corresponding first pads.

(Supplementary Note 2)

The light-emitting device according to supplementary note 1, wherein the electric conductor is further disposed on the bottom surface.

(Supplementary Note 3)

The light-emitting device according to supplementary note 1 or 2, wherein height from the placement surface to the upper wall surface is larger than height from the placement surface to the light exit surface.

(Supplementary Note 4)

The light-emitting device according to any one of supplementary notes 1 to 3, wherein the package has a polygonal shape when viewed from the direction orthogonal to the light exit surface, the number of the outer side surfaces and the outer wall surfaces is plural, respectively, and the electric conductor is not disposed on a corner portion defined by the upper wall surface and the outer wall surfaces adjacent to each other, on a ridge portion defined by the outer wall surfaces adjacent to each other, and on a ridge portion defined by the outer side surfaces adjacent to each other.

(Supplementary Note 5)

The light-emitting device according to any one of supplementary notes 1 to 4, wherein the electric conductor is disposed on the upper wall surface such that a ratio of an area of the electric conductor to an area of the upper wall surface is 50% or more.

(Supplementary Note 6)

The light-emitting device according to any one of supplementary notes 1 to 5, wherein the window includes a dummy pad disposed on the lower surface and mounting the light source.

(Supplementary Note 7)

The light-emitting device according to any one of supplementary notes 1 to 6, wherein each of the connectors includes a third pad mounting the light source is mounted, and an electrically conductive line electrically connecting the first pad and the third pad.

(Supplementary Note 8)

The light-emitting device according to any one of supplementary notes 1 to 6, wherein one connector of the plurality of connectors includes a third pad mounting the light source is mounted, and an electrically conductive line electrically connecting the first pad and the third pad, and another connector of the plurality of connectors includes a fourth pad electrically connected to the first pad, and a wire electrically connecting the light source and the fourth pad.

(Supplementary Note 9)

The light-emitting device according to any one of supplementary notes 1 to 6, wherein each of the connectors includes a fourth pad electrically connected to the first pad, and a wire electrically connecting the light source and the fourth pad.

(Supplementary Note 10)

The light-emitting device according to any one of supplementary notes 1 to 9, wherein the window base is a silicon substrate.

(Supplementary Note 11)

The light-emitting device according to supplementary note 10, wherein the window includes an antireflection film disposed on at least one surface of the light exit surface and the lower surface.

In the present embodiment of supplementary note 1, the electric conductor is disposed on the placement surface, the inner wall surface, and the upper wall surface, but is not disposed on the outer wall surface and the outer side surface.

This specification also discloses the following supplementary notes.

(Supplementary Note 12)

A light-emitting device including:

a light source;

a window mounting the light source; and a package defining a space with the window, the light source being disposed in the space, wherein the window includes a window base including a light exit surface, a lower surface opposing the light exit surface, and a side surface coupling the light exit surface and the lower surface, and an electrically conductive body disposed on the lower surface of the window base, the package includes a base portion formed with a recess open toward the lower surface, the base portion including a placement surface disposed along an edge of the recess and opposing the lower surface, a bottom surface opposing the placement surface, and an outer side surface coupled to the bottom surface, a wall portion including an inner wall surface coupled to the placement surface and opposing the side surface, an outer wall surface opposing the inner wall surface and coupled to the outer side surface, and an upper wall surface coupling the inner wall surface and the outer wall surface, the wall portion disposed along the window base when viewed from a direction orthogonal to the light exit surface, a reflection portion disposed on a surface of the recess, being configured to reflect light emitted from the light source to the window, and an electric conductor disposed on the placement surface, the inner wall surface, the upper wall surface, and the outer wall surface, the window base is configured to transmit the light reflected on the reflection portion, the electrically conductive body includes a plurality of first pads opposing the placement surface, and a plurality of connectors electrically connecting the light source and the plurality of first pads, and the electric conductor includes a plurality of second pads disposed on the placement surface to oppose corresponding first pads of the plurality of first pads and electrically connected to the corresponding first pads.

(Supplementary Note 13)

The light-emitting device according to supplementary note 12, wherein the electric conductor is further disposed on the bottom surface.

(Supplementary Note 14)

The light-emitting device according to supplementary note 12 or 13, wherein height from the placement surface to the upper wall surface is larger than height from the placement surface to the light exit surface.

(Supplementary Note 15)

The light-emitting device according to any one of supplementary notes 12 to 14, wherein the package has a polygonal shape when viewed from the direction orthogonal to the light exit surface, the number of the outer side surfaces and the outer wall surfaces is plural, respectively, and the electric conductor is not disposed on a corner portion defined by the upper wall surface and the outer wall surfaces adjacent to each other, on a ridge portion defined by the outer wall surfaces adjacent to each other, and on a ridge portion defined by the outer side surfaces adjacent to each other.

(Supplementary Note 16)

The light-emitting device according to any one of supplementary notes 12 to 15, wherein the electric conductor is disposed on the upper wall surface such that a ratio of an area of the electric conductor to an area of the upper wall surface is 50% or more.

(Supplementary Note 17)

The light-emitting device according to any one of supplementary notes 12 to 16, wherein the electric conductor is disposed on the outer wall surface such that a ratio of an area of the electric conductor to an area of the outer wall surface is 50% or more.

(Supplementary Note 18)

The light-emitting device according to any one of supplementary notes 12 to 17, wherein the window includes a dummy pad disposed on the lower surface and mounting the light source.

(Supplementary Note 19)

The light-emitting device according to any one of supplementary notes 12 to 18, wherein each of the connectors includes a third pad mounting the light source is mounted, and an electrically conductive line electrically connecting the first pad and the third pad.

(Supplementary Note 20)

The light-emitting device according to any one of supplementary notes 12 to 18, wherein one connector of the plurality of connectors includes a third pad mounting the light source is mounted, and an electrically conductive line electrically connecting the first pad and the third pad, and another connector of the plurality of connectors includes a fourth pad electrically connected to the first pad, and a wire electrically connecting the light source and the fourth pad.

(Supplementary Note 21)

The light-emitting device according to any one of supplementary notes 12 to 18, wherein each of the connectors includes a fourth pad electrically connected to the first pad, and a wire electrically connecting the light source and the fourth pad.

(Supplementary Note 22)

The light-emitting device according to any one of supplementary notes 12 to 21, wherein the window base is a silicon substrate.

(Supplementary Note 23)

The light-emitting device according to supplementary note 22, wherein the window includes an antireflection film disposed on at least one surface of the light exit surface and the lower surface.

In the embodiment of supplementary note 12, the electric conductor is disposed on the placement surface, the inner wall surface, the upper wall surface, and the outer wall surface, but is not disposed on the outer side surface.

This specification also discloses the following supplementary notes.

(Supplementary Note 24)

A light detection device comprising:

a photodetector;

a window mounting the photodetector; and a package defining a space with the window, the photodetector being disposed in the space, wherein the window includes a window base including a light incident surface, a lower surface opposing the light incident surface, and a side surface coupling the light incident surface and the lower surface, and an electrically conductive body disposed on the lower surface of the window base, the package includes a base portion formed with a recess open toward the lower surface, the base portion including a placement surface disposed along an edge of the recess and opposing the lower surface, a bottom surface opposing the placement surface, and an outer side surface coupled to the bottom surface, a wall portion including an inner wall surface coupled to the placement surface and opposing the side surface, an outer wall surface opposing the inner wall surface and coupled to the outer side surface, and an upper wall surface coupling the inner wall surface and the outer wall surface, the wall portion disposed along the window base when viewed from a direction orthogonal to the light incident surface, a reflection portion disposed on a surface of the recess, being configured to reflect light incident from the window to the photodetector, and an electric conductor disposed on the placement surface, the inner wall surface, the upper wall surface, the outer wall surface, and the outer side surface, the window base is configured to transmit light incident from an outside, the electrically conductive body includes a plurality of first pads opposing the placement surface, and a plurality of connectors electrically connecting the photodetector and the plurality of first pads, and the electric conductor includes a plurality of second pads disposed on the placement surface to oppose corresponding first pads of the plurality of first pads and electrically connected to the corresponding first pads.

(Supplementary Note 25)

The light detection device according to supplementary note 24, wherein the electric conductor is further disposed on the bottom surface.

(Supplementary Note 26)

The light detection device according to supplementary note 24 or 25, wherein height from the placement surface to the upper wall surface is larger than height from the placement surface to the light incident surface.

(Supplementary Note 27)

The light detection device according to any one of supplementary notes 24 to 26, wherein the package has a polygonal shape when viewed from the direction orthogonal to the light incident surface, the number of the outer side surfaces and the outer wall surfaces is plural, respectively, and the electric conductor is not disposed on a corner portion defined by the upper wall surface and the outer wall surfaces adjacent to each other, on a ridge portion defined by the outer wall surfaces adjacent to each other, and on a ridge portion defined by the outer side surfaces adjacent to each other.

(Supplementary Note 28)

The light detection device according to any one of supplementary notes 24 to 27, wherein the electric conductor is disposed on the upper wall surface such that a ratio of an area of the electric conductor to an area of the upper wall surface is 50% or more.

(Supplementary Note 29)

The light detection device according to any one of supplementary notes 24 to 28, wherein the electric conductor is disposed on the outer wall surface and the outer side surface such that a ratio of an area of the electric conductor to a sum of an area of the outer wall surface and an area of the outer side surface is 50% or more.

(Supplementary Note 30)

The light detection device according to any one of supplementary notes 24 to 29, wherein the window includes a dummy pad disposed on the lower surface and mounting the photodetector.

(Supplementary Note 31)

The light detection device according to any one of supplementary notes 24 to 30, wherein each of the connectors includes a third pad mounting the photodetector, and an electrically conductive line electrically connecting the first pad and the third pad.

(Supplementary Note 32)

The light detection device according to any one of supplementary notes 24 to 30, wherein one connector of the plurality of connectors includes a third pad mounting the photodetector, and an electrically conductive line electrically connecting the first pad and the third pad, and another connector of the plurality of connectors includes a fourth pad electrically connected to the first pad, and a wire electrically connecting the photodetector and the fourth pad.

(Supplementary Note 33)

The light detection device according to any one of supplementary notes 24 to 30, wherein each of the connectors includes a fourth pad electrically connected to the first pad, and a wire electrically connecting the photodetector and the fourth pad.

(Supplementary Note 34)

The light detection device according to any one of supplementary notes 24 to 33, wherein the window base is a silicon substrate.

(Supplementary Note 35)

The light detection device according to supplementary note 34, wherein the window includes an antireflection film disposed on at least one surface of the light incident surface and the lower surface.

An embodiment of the supplementary note 24 is the light detection device including the photodetector, the window 20, and the package 30. The light detection device includes, for example, the same configuration as the light-emitting device D1 except for the photodetector. The photodetector includes a light detection element. Examples of the light detection element include a photodiode element capable of sensing infrared light. Light incident from the outside is reflected on the reflection portion 32, and the photodetector receives the light reflected from the reflection portion 32. The photodetector may be connected to the electric conductor 34 having a high heat dissipation effect, and heat generated in the light detection device is effectively dissipated through the electric conductor 34.

For example, in the light detection device including a photodiode, generally, the size of the electric conductor tends to be reduced from the viewpoint of reducing the generation of noise, for example. However, in the light detection device of this supplementary note, the electric conductor is disposed in a region from the placement surface to the upper wall surface to improve the heat dissipation through the electric conductor.

This specification also discloses the following supplementary notes.

(Supplementary Note 36)

A light detection device comprising:
a photodetector;
a window mounting the photodetector; and
a package defining a space with the window, the photodetector being disposed in the space, wherein
the window includes
a window base including a light incident surface, a lower surface opposing the light incident surface, and a side surface coupling the light incident surface and the lower surface, and
an electrically conductive body disposed on the lower surface of the window base,
the package includes
a base portion formed with a recess open toward the lower surface, the base portion including a placement surface disposed along an edge of the recess and opposing the lower surface, a bottom surface opposing the placement surface, and an outer side surface coupled to the bottom surface,
a wall portion including an inner wall surface coupled to the placement surface and opposing the side surface, an outer wall surface opposing the inner wall surface and coupled to the outer side surface, and an upper wall surface coupling the inner wall surface and the outer wall surface, the wall portion disposed along the window base when viewed from a direction orthogonal to the light incident surface,
a reflection portion disposed on a surface of the recess, being configured to reflect light incident from the window to the photodetector, and
an electric conductor disposed on the placement surface, the inner wall surface, and the upper wall surface,
the window base is configured to transmit light incident from an outside,
the electrically conductive body includes a plurality of first pads opposing the placement surface, and a plurality of connectors electrically connecting the photodetector and the plurality of first pads, and
the electric conductor includes a plurality of second pads disposed on the placement surface to oppose corresponding first pads of the plurality of first pads and electrically connected to the corresponding first pads.

(Supplementary Note 37)

The light detection device according to supplementary note 36, wherein the electric conductor is further disposed on the bottom surface.

(Supplementary Note 38)

The light detection device according to supplementary note 36 or 37, wherein height from the placement surface to the upper wall surface is larger than height from the placement surface to the light incident surface.

(Supplementary Note 39)

The light detection device according to any one of supplementary notes 36 to 38, wherein
the package has a polygonal shape when viewed from the direction orthogonal to the light incident surface,
the number of the outer side surfaces and the outer wall surfaces is plural, respectively, and
the electric conductor is not disposed on a corner portion defined by the upper wall surface and the outer wall surfaces adjacent to each other, on a ridge portion defined by the outer wall surfaces adjacent to each other, and on a ridge portion defined by the outer side surfaces adjacent to each other.

(Supplementary Note 40)

The light detection device according to any one of supplementary notes 36 to 39, wherein the electric conductor is disposed on the upper wall surface such that a ratio of an area of the electric conductor to an area of the upper wall surface is 50% or more.

(Supplementary Note 41)

The light detection device according to any one of supplementary notes 36 to 40, wherein the window includes a dummy pad disposed on the lower surface and mounting the photodetector.

(Supplementary Note 42)

The light detection device according to any one of supplementary notes 36 to 41, wherein each of the connectors includes a third pad mounting the photodetector, and an electrically conductive line electrically connecting the first pad and the third pad.

(Supplementary Note 43)

The light detection device according to any one of supplementary notes 36 to 41, wherein
one connector of the plurality of connectors includes a third pad mounting the photodetector, and an electrically conductive line electrically connecting the first pad and the third pad, and
another connector of the plurality of connectors includes a fourth pad electrically connected to the first pad, and a wire electrically connecting the photodetector and the fourth pad.

(Supplementary Note 44)

The light detection device according to any one of supplementary notes 36 to 41, wherein each of the connectors includes a fourth pad electrically connected to the first pad, and a wire electrically connecting the photodetector and the fourth pad.

(Supplementary Note 45)

The light detection device according to any one of supplementary notes 36 to 44, wherein the window base is a silicon substrate.

(Supplementary Note 46)

The light detection device according to supplementary note 45, wherein the window includes an antireflection film disposed on at least one surface of the light incident surface and the lower surface.

In the embodiment of supplementary note 36, the electric conductor is disposed on the placement surface, the inner wall surface, and the upper wall surface, but is not disposed on the outer wall surface and the outer side surface.

This specification also discloses the following supplementary notes.

(Supplementary Note 47)

A light detection device comprising:

a photodetector;

a window mounting the photodetector; and a package defining a space with the window, the photodetector being disposed in the space, wherein the window includes a window base including a light incident surface, a lower surface opposing the light incident surface, and a side surface coupling the light incident surface and the lower surface, and an electrically conductive body disposed on the lower surface of the window base, the package includes a base portion formed with a recess open toward the lower surface, the base portion including a placement surface disposed along an edge of the recess and opposing the lower surface, a bottom surface opposing the placement surface, and an outer side surface coupled to the bottom surface, a wall portion including an inner wall surface coupled to the placement surface and opposing the side surface, an outer wall surface opposing the inner wall surface and coupled to the outer side surface, and an upper wall surface coupling the inner wall surface and the outer wall surface, the wall portion disposed along the window base when viewed from a direction orthogonal to the light incident surface, a reflection portion disposed on a surface of the recess, being configured to reflect light incident from the window to the photodetector, and an electric conductor disposed on the placement surface, the inner wall surface, the upper wall surface, and the outer wall surface, the window base is configured to transmit light incident from an outside, the electrically conductive body includes a plurality of first pads opposing the placement surface, and a plurality of connectors electrically connecting the photodetector and the plurality of first pads, and the electric conductor includes a plurality of second pads disposed on the placement surface to oppose corresponding first pads of the plurality of first pads and electrically connected to the corresponding first pads.

(Supplementary Note 48)

The light detection device according to supplementary note 47, wherein the electric conductor is further disposed on the bottom surface.

(Supplementary Note 49)

The light detection device according to supplementary note 47 or 48, wherein height from the placement surface to the upper wall surface is larger than height from the placement surface to the light incident surface.

(Supplementary Note 50)

The light detection device according to any one of supplementary notes 47 to 49, wherein the package has a polygonal shape when viewed from the direction orthogonal to the light incident surface, the number of the outer side surfaces and the outer wall surfaces is plural, respectively, and the electric conductor is not disposed on a corner portion defined by the upper wall surface and the outer wall surfaces adjacent to each other, on a ridge portion defined by the outer wall surfaces adjacent to each other, and on a ridge portion defined by the outer side surfaces adjacent to each other.

(Supplementary Note 51)

The light detection device according to any one of supplementary notes 47 to 50, wherein the electric conductor is disposed on the upper wall surface such that a ratio of an area of the electric conductor to an area of the upper wall surface is 50% or more.

(Supplementary Note 52)

The light detection device according to any one of supplementary notes 47 to 51, wherein the electric conductor is disposed on the outer wall surface such that a ratio of an area of the electric conductor to an area of the outer wall surface is 50% or more.

(Supplementary Note 53)

The light detection device according to any one of supplementary notes 47 to 52, wherein the window includes a dummy pad disposed on the lower surface and mounting the photodetector.

(Supplementary Note 54)

The light detection device according to any one of supplementary notes 47 to 53, wherein each of the connectors includes a third pad mounting the photodetector, and an electrically conductive line electrically connecting the first pad and the third pad.

(Supplementary Note 55)

The light detection device according to any one of supplementary notes 47 to 53, wherein one connector of the plurality of connectors includes a third pad mounting the photodetector, and an electrically conductive line electrically connecting the first pad and the third pad, and another connector of the plurality of connectors includes a fourth pad electrically connected to the first pad, and a wire electrically connecting the photodetector and the fourth pad.

(Supplementary Note 56)

The light detection device according to any one of supplementary notes 47 to 53, wherein each of the connectors includes a fourth pad electrically connected to the first pad, and a wire electrically connecting the photodetector and the fourth pad.

(Supplementary Note 57)

The light detection device according to any one of supplementary notes 47 to 56, wherein the window base is a silicon substrate.

(Supplementary Note 58)

The light detection device according to supplementary note 57, wherein the window includes an antireflection film disposed on at least one surface of the light incident surface and the lower surface.

In the embodiment of supplementary note 47, the electric conductor is disposed on the placement surface, the inner wall surface, the upper wall surface, and the outer wall surface, but is not disposed on the outer side surface.

REFERENCE SIGNS LIST

10 LIGHT SOURCE
20 WINDOW
22 LIGHT EXIT SURFACE
23 LOWER SURFACE
24 SIDE SURFACE
25 FIRST PAD
26 THIRD PAD
27 ELECTRICALLY CONDUCTIVE LINE
28 DUMMY PAD
30 PACKAGE
31 CORNER PORTION
32 REFLECTION PORTION
33 RIDGE PORTION
34 ELECTRIC CONDUCTOR
36 SECOND PAD
40 BASE PORTION
42 RECESS
44 PLACEMENT SURFACE
46 BOTTOM SURFACE
47 EDGE
48 OUTER SIDE SURFACE
50 WALL PORTION
52 INNER WALL SURFACE
54 OUTER WALL SURFACE
56 UPPER WALL SURFACE
65p FOURTH PAD
AG1 BLOCK
AR ANTIREFLECTION FILM
Ax1 DIRECTION
CT1 to CT4 CUTTING PLANNED LINE
D1, D2, D3 LIGHT-EMITTING DEVICE
SC1 SPACE
CN1 CONNECTOR
WD1 ELECTRICALLY CONDUCTIVE BODY

The invention claimed is:
1. A light-emitting device comprising:
a light source;
a window mounting the light source; and
a package defining a space with the window, the light source being disposed in the space, wherein
the window includes
a window base including a light exit surface, a lower surface opposing the light exit surface, and a side surface coupling the light exit surface and the lower surface, and
an electrically conductive body disposed on the lower surface of the window base,
the package includes
a base portion formed with a recess open toward the lower surface, the base portion including a placement surface disposed along an edge of the recess and opposing the lower surface, a bottom surface opposing the placement surface, and an outer side surface coupled to the bottom surface,
a wall portion including an inner wall surface coupled to the placement surface and opposing the side surface, an outer wall surface opposing the inner wall surface and coupled to the outer side surface, and an upper wall surface coupling the inner wall surface and the outer wall surface, the wall portion disposed along a perimeter of the window base and extending from the window base in a direction orthogonal to the light exit surface,
a reflection portion disposed on a surface of the recess, being configured to reflect light emitted from the light source to the window, and
an electric conductor disposed on the placement surface, the inner wall surface, the upper wall surface, the outer wall surface, and the outer side surface,
the window base is configured to transmit the light reflected on the reflection portion,
the electrically conductive body includes a plurality of first pads opposing the placement surface, and a plurality of connectors electrically connecting the light source and the plurality of first pads,
the electric conductor includes a plurality of second pads disposed on the placement surface to oppose corresponding first pads of the plurality of first pads and electrically connected to the corresponding first pads,
the lower surface of the window base and the placement surface of the base portion each include a plurality of corner portions,
each of the plurality of first pads includes a connection portion disposed on a corresponding corner portion of the plurality of corner portions of the lower surface,
each of the plurality of second pads includes an electric conductor portion disposed on a corresponding corner portion of the plurality of corner portions of the placement surface, and
the connection portion and the electric conductor portion corresponding to each other are connected to each other.

2. The light-emitting device according to claim 1, wherein the electric conductor is further disposed on the bottom surface.

3. The light-emitting device according to claim 1, wherein a height from the placement surface to the upper wall surface is larger than a height from the placement surface to the light exit surface.

4. The light-emitting device according to claim 1, wherein the package has a polygonal shape when viewed from the direction orthogonal to the light exit surface,
the number of the outer side surfaces and the outer wall surfaces is plural, respectively, and
the electric conductor is not disposed on a corner portion defined by the upper wall surface and the outer wall surfaces adjacent to each other, on a ridge portion defined by the outer wall surfaces adjacent to each other, and on a ridge portion defined by the outer side surfaces adjacent to each other.

5. The light-emitting device according to claim 1, wherein the electric conductor is disposed on the upper wall surface such that a ratio of an area of the electric conductor to an area of the upper wall surface is 50% or more.

6. The light-emitting device according to claim 1, wherein the electric conductor is disposed on the outer wall surface and the outer side surface such that a ratio of an area of the electric conductor to a sum of an area of the outer wall surface and an area of the outer side surface is 50% or more.

7. The light-emitting device according to claim 1, wherein the window includes a dummy pad disposed on the lower surface and mounting the light source.

8. The light-emitting device according to claim 1, wherein each of the connectors includes a third pad mounting the light source, and an electrically conductive line electrically connecting the first pad and the third pad.

9. The light-emitting device according to claim 1, wherein one connector of the plurality of connectors includes a third pad mounting the light source, and an electrically conductive line electrically connecting the first pad and the third pad, and another connector of the plurality of connectors includes a fourth pad electrically connected to the first pad, and a wire electrically connecting the light source and the fourth pad.

10. The light-emitting device according to claim 1, wherein each of the connectors includes a fourth pad electrically connected to the first pad, and a wire electrically connecting the light source and the fourth pad.

11. The light-emitting device according to claim 1, wherein the window base is a silicon substrate.

12. The light-emitting device according to claim 11, wherein the window includes an antireflection film disposed on at least one surface of the light exit surface and the lower surface.

13. A method for making the light-emitting device according to claim 1, the method comprising:

preparing a plurality of the windows mounting the light source;

preparing a block including a plurality of the packages coupled each other in an array;

mounting the window on each of the packages of the block to electrically connect the first pad and the second pad corresponding to each other; and separating the block to obtain the plurality of packages mounting the corresponding window.

14. The method for making the light-emitting device according to claim 13, wherein a height from the placement surface to the upper wall surface is larger than a height from the placement surface to the light exit surface in a state where the window is mounted to correspond to each package of the block, and when the block is separated, the block is diced along a cutting planned line set between the packages adjacent to each other after the upper wall surface is attached to a dicing tape.

\* \* \* \* \*